(12) United States Patent      (10) Patent No.: US 11,522,557 B1
Rutten et al.      (45) Date of Patent: Dec. 6, 2022

(54) SYSTEM AND METHOD OF CALIBRATION OF SIGMA-DELTA CONVERTER USING TONE INJECTION

(71) Applicant: NXP B.V., Eindhoven (NL)

(72) Inventors: Robert Rutten, Nistelrode (NL); Martin Kessel, Bannewitz (DE); Hendrik van der Ploeg, Waalre (NL); Lucien Johannes Breems, Waalre (NL); Muhammed Bolatkale, Delft (NL); Evert-Jan Pol, Valkensward (NL); Manfred Zupke, Hamburg (DE); Bernard Burdiek, Halstenbek (DE); Johannes Hubertus Antonius Brekelmans, Nederweert (NL); Shagun Bajoria, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/388,157

(22) Filed: Jul. 29, 2021

(51) Int. Cl.
     *H03M 3/00*      (2006.01)

(52) U.S. Cl.
     CPC ............. *H03M 3/38* (2013.01); *H03M 3/496* (2013.01)

(58) Field of Classification Search
     CPC .................. H03M 3/38; H03M 3/496
     See application file for complete search history.

(56) References Cited

U.S. PATENT DOCUMENTS

| | | | |
|---|---|---|---|
| 7,321,325 B2 | 1/2008 | Hsieh et al. | |
| 7,324,028 B2 | 1/2008 | Hsieh et al. | |
| 7,894,536 B2 * | 2/2011 | Risbo | H03M 3/388 375/243 |
| 8,294,605 B1 * | 10/2012 | Pagnanelli | H03M 3/30 341/145 |
| 9,577,657 B1 * | 2/2017 | Clara | H03M 1/109 |
| 2008/0258949 A1 * | 10/2008 | Galton | H03M 1/1004 341/120 |
| 2011/0140942 A1 * | 6/2011 | Pagnanelli | H03M 3/50 341/144 |
| 2016/0079994 A1 * | 3/2016 | Lee | H03M 1/123 341/118 |

(Continued)

OTHER PUBLICATIONS

Cao, Zhiheng et al. "A Digital Background Calibration Method for Mash Σ-Δ Modulators by Using Coefficient Estimation.". IEEE 2005 pp. 3091-3094.

(Continued)

*Primary Examiner* — Lam T Mai

(57) ABSTRACT

A digital conversion system including a sigma-delta converter, a tone generator that generates injects a tone signal into the conversion path of the sigma-delta converter at a frequency that is outside operating signal frequency range, a tone detector that isolates and detects a level of the injected tone signal and provides a corresponding tone level value, a tone ratio comparator that converts the tone level value into a tone level ratio and that compares the converted tone level ratio with an expected tone level ratio to provide an error signal, and a loop controller that converts the error signal to a correction signal to adjust a loop filter frequency the sigma-delta converter. Tones may be serially injected one at a time or simultaneously in parallel for determining a measured tone level ratio for comparison with a corresponding one of multiple stored expected tone level ratios.

20 Claims, 14 Drawing Sheets

(56) References Cited

U.S. PATENT DOCUMENTS

2016/0182075 A1* 6/2016 Devarajan ............. H03M 1/121
  341/120
2020/0235749 A1* 7/2020 Wang ..................... H03M 3/34

OTHER PUBLICATIONS

Silva-Rivas F. et al. "Digital Based Calibration Techniques for Continuous-time Bandpass Sigma-Delta Analog-to-Digital. Converters." *Analog Integrated Circuits and Signal Processing.* Apr. 2009. pp. 91-95.
Duggal, Ashwin et al. "Calibration of Delta-Sigma Data Converters in Synchronous Demodulation Sensing Applications.". *IEEE Sensors Journal.* Feb. 2011. pp. 1524-1527.
Breems, Lucien et al. "A 2.2 GHz Continuous-Time Δ Σ ADC with -102 dBc THD and 25 MHz Bandwidth." *IEEE Journal of Solid-State Circuits.* vol. 51, No. 12. Dec. 2016. pp. 2906-2916.
Schuchman, Leonard. "Dither Signals and Their Effect on Quantization Noise." *IEEE Transactions on Communication. Technology.* Dec. 1964. pp. 162-165.
Lu, Cho-Ying et al. "A Sixth-Order 200 MHz IF Bandpass Sigma-Delta Modulator with Over 68 dB SNDR in 10 MHz. Bandwidth." *IEEE Journal of Solid-State Circuits.* vol. 45, No. 6. Jun. 2010. pp. 1122-1136.

\* cited by examiner

SYSTEM AND METHOD OF CALIBRATION OF SIGMA-DELTA CONVERTER USING TONE INJECTION

BACKGROUND

Field of the Invention

The present invention relates in general to calibrating a sigma-delta converter, and more particularly to a system and method of frequency calibration of a sigma-delta converter using tone injection, tone detection, and tone level ratio comparison with expected values.

Description of the Related Art

In higher order sigma-delta converters including sigma-delta analog to digital converters (ADCs) and the like, resonators are typically used to get a better signal to quantization noise ratio (SQNR) in the band of interest (BoI). The resonator frequencies are determined by the loop filter in the converter design. Typically, the resonator frequencies are set by passive devices such as a combination of resistors and capacitors and may also be set by active components such as transistors and the like. The resonator frequencies determine the level of the quantization noise in the BoI. The elements setting these resonator frequencies suffer, however, from manufacturing variation and temperature dependency. If the quantization noise is a significant contributor to the total noise performance, the resonator frequencies need to be calibrated and may require tracking over temperature variation.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A system and method of calibration of a sigma-delta converter as described herein uses tone injection. When the sigma-delta converter is actively processing an input signal, then the frequency of each injected tone is located between operative signal bands so that it does not affect converter operation. In addition, the injected tones have sufficiently low side spurs and noise to minimize impact on conversion quality. Calibration may also be performed if the sigma-delta converter is otherwise idle or not actively processing an input signal allowing for greater tone frequency selection. The tone level at the output of the sigma-delta converter may be used as a metric to adjust the resonator frequency. A calibration system in accordance with an embodiment of the present disclosure includes a tone generator that injects at least one tone, a tone isolator to isolate the frequency band where the tone is located, a level estimator that estimates the tone level, a tone level comparator that compares an actual tone level ratio with an expected tone level ratio to generate an error signal, and a loop controller that converts the error into a correction signal used to adjust the resonator frequency to an optimum level. A system and method of calibration of a sigma-delta converter as described herein can be used for start-up calibration or background tracking calibration when the converter is actively processing an input signal.

Figure 1:
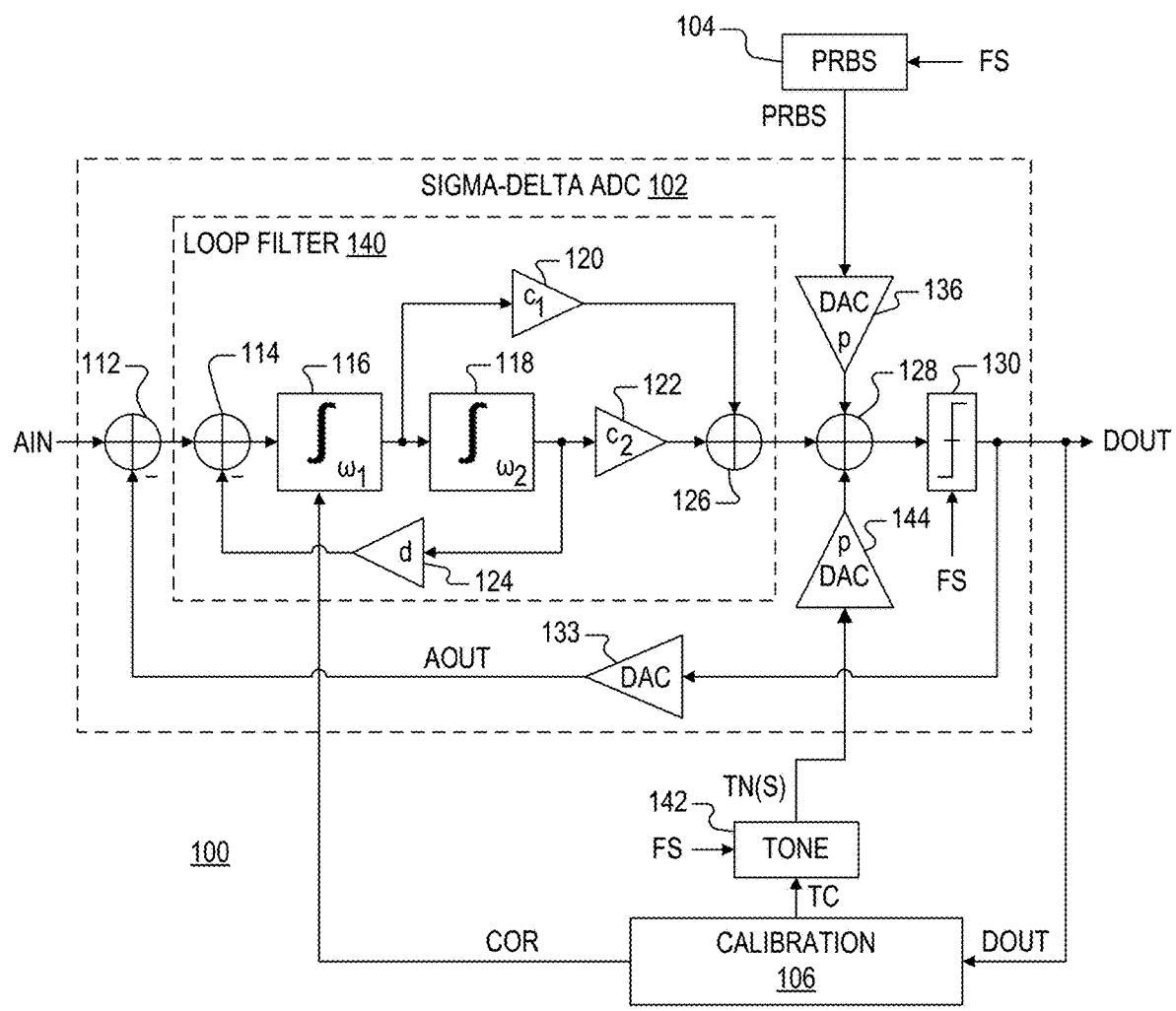
FIG. 1 is a simplified block diagram of a digital conversion system including calibration circuitry implemented according to an embodiment of the present disclosure.

FIG. 1 is a simplified block diagram of a digital conversion system 100 including calibration circuitry 106 implemented according to an embodiment of the present disclosure. In the illustrated embodiment, the digital conversion system 100 includes a sigma-delta analog to digital converter (ADC) 102 receiving a Pseudo Random Bit Stream (PRBS) signal from a PRBS generator 104 used as a dither signal, and also includes the calibration circuitry 106 for calibrating the sigma-delta ADC 102. The PRBS signal is a pseudo-random signal used as a dither input injected at the input of the quantizer 130 to improve performance of the digital conversion system 100. It is noted that a system and method of calibration as described herein operates in substantially the same manner with or without injection of the PRBS signal. In the illustrated embodiment, the sigma-delta ADC 102 includes a loop filter 140 that determines at least one resonator frequency used to get a better signal to quantization noise ratio (SQNR) in the band of interest (BoI) of the sigma-delta ADC 102. In general, the resonator frequencies of a converter determine the level of the quantization noise in the BoI. The elements setting these resonator frequencies suffer, however, from manufacturing variation and temperature dependency. Such elements may include any combination of passive elements (e.g., resistors, capacitors, and inductors) and active elements (e.g., transistors and the like). If the quantization noise is a significant contributor to the total noise performance, each resonator frequency should be calibrated and tracked over temperature.

An analog input signal AIN is provided to a positive input of an adder 112 of the sigma-delta ADC 102. It is noted that although the conversion system is illustrated by an ADC, the input signal AIN may alternatively be a digital signal. The output of the adder 112 is provided to a positive input of another adder 114, having its output coupled to an input of an integrator 116 with radian frequency $\omega_1$. The output of the integrator 116 is coupled to an input of another integrator 118 with radian frequency $\omega_2$ and to an input of an amplifier 120 with a gain of $c_1$. It is noted that $\omega_1$ and $\omega_2$ may be referred to as the gains of the integrators 116 and 118, respectively. The output of the integrator 118 is coupled to an input of an amplifier 122 with a gain of $c_2$ and to an input of another amplifier 124 with a gain of d. The output of the amplifier 124 is provided to a negative input of the adder 114. The outputs of the amplifiers 120 and 122 are provided to respective positive inputs of an adder 126, having its output coupled to a positive input of another adder 128. The output of the adder 128 is coupled to the input of a quantizer 130, having its output providing a digital output signal DOUT.

In one embodiment, DOUT is a single-bit output, such as a series of 1's and 0's or the like for a single-bit quantizer 130. In another embodiment, DOUT may be a multibit value. A digital to analog converter (DAC) 133 converts DOUT to AOUT by converting digital input "1" to +1 and digital input "0" to −1. DOUT is fed back to an input of the DAC 133 having an output providing an analog output signal AOUT (an analog version of DOUT) provided to a negative input of the adder 112. The adders 112 and 114 may alternatively be referred to as subtractors in which the adder 112 develops its output by subtracting AOUT from AIN and the adder 114 develops its output by subtracting the output of the amplifier 124 from the output of the adder 112. The adders 126 and 128 add their respective inputs to develop their outputs in the illustrated configuration.

The PRBS signal from the PRBS generator 104 is provided to an input of a digital to analog converter (DAC) 136 the sigma-delta ADC 102, in which the DAC 136 has a gain of p. The output of the DAC 136 is provided to another positive input of the adder 128. The DOUT signal is provided to an input of the calibration circuitry 106, having its output providing a correction signal COR to a frequency adjust input of the sigma-delta ADC 102. The calibration circuitry 106 provides a tone control (TC) signal to an input of a tone generator 142, which generates one or more tone signals TN(S) which are provided to respective inputs of another DAC 144 having a gain of p. Although the DAC 144 is shown as a single DAC for converting a single tone TN, it may also generally represent multiple DACs for converting multiple tones (e.g., TN1, TN2) at a time as further described herein. Each output of the DAC 144 (e.g., including one or more outputs) is coupled to a corresponding input of the adder 128, which sums the outputs of the adder 126 and the DACs 136 and 144 and provides the sum to the input of the quantizer 130. The adders 114 and 126, the integrators 116 and 118, and the amplifiers 120, 122, and 124 collectively form the loop filter 140 within the sigma-delta ADC 102. In the illustrated configuration, the sigma-delta ADC 102 includes the adders 112 and 128, the DACs 133, 136, and 144, the quantizer 130, and the loop filter 140. The PRBS generator 104, the quantizer 130, and the tone generator 142 each receive a sample signal FS.

The COR signal from the calibration circuitry 106 is used to adjust a resonant frequency of the loop filter 140 of the sigma-delta ADC 102 as further described herein. In one embodiment, the COR signal is provided to adjust the gain $\omega_1$ of the integrator 116. In alternative embodiments, COR may be used to adjust other values or parameters, such as $c_1$, $c_2$, d, $\omega_2$, or the like or a combination of such parameters. In a more particular embodiment, $\omega_1$=2.5 Megahertz (MHz), $\omega_2$=400 kilohertz (kHz), FS has an oversampling frequency of 100 MHz, $c_1$=0.2, $c_2$=0.25, d=0.05, and p=0.05. These are approximate values for a particular configuration and alternative values are contemplated for different implementations. In addition, one or more of these parameters are adjusted during calibration to adjust a resonant frequency of the loop filter 140 and hence a notch frequency at the output of the sigma-delta ADC 102. The location of the notch frequency modifies the level of one or more tone signals injected in the conversion path of the ADC 102.

The calibration circuitry 106 controls the tone generator 142 to select one or more tones that are injected into the signal path of the sigma-delta converter 102, isolates the frequency band where each selected tone is located within the DOUT signal, estimates a level of each tone, compares a tone level ratio with an expected tone level ratio to generate an error signal, and converts the error into the COR signal used to adjust the resonator frequency of the loop filter 140 to an optimum level. A system and method of calibration of a sigma-delta converter as described herein can be used for start-up calibration and background tracking calibration, which means that calibration may be used while the sigma-delta converter 102 is processing the input signal AIN.

In alternative embodiments, AIN may be a digital signal in which the DAC 133 may be omitted or replaced by a digital-to-digital converter or amplifier. The sigma-delta ADC 102 is an example of a sigma-delta system implemented according to a $2^{nd}$ order feedforward architecture. The present system and method of calibration as described herein may be applied to other structures or architectures, such as feedback architectures, combined feedback/feedforward architectures, and higher order configurations (e.g., $3^{rd}$ order, $4^{th}$ order, etc.) and the like. Although the tone generator 142 is shown external to the sigma-delta ADC 102, it may be also be internally provided in different embodiments.

Figure 2:
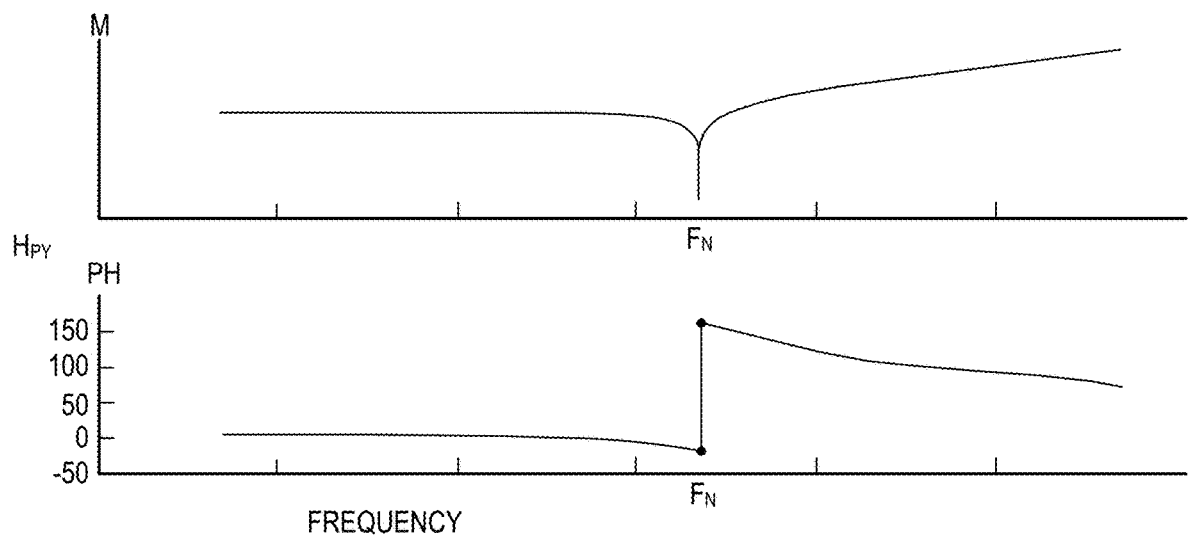
FIG. 2 shows a pair of graphic diagrams plotting the magnitude (M) and phase (PH) versus frequency of a transfer function $H_{PY}$ from the quantizer input to the output DOUT of the sigma-delta ADC of FIG. 1 according to one embodiment of the present disclosure.

FIG. 2 shows a pair of graphic diagrams plotting the magnitude (M) and phase (PH) versus frequency of a transfer function $H_{PY}$ from the input of the quantizer 130 to the output DOUT of the sigma-delta ADC 102 according to one embodiment of the present disclosure. The particular units of the magnitude and frequency are not shown, but magnitude is typically measured in decibels (dB) and frequency is typically measured in Hertz (Hz). The units of phase are shown in degrees. The resonant frequency of the loop filter 140 creates a notch (or zero in the zero/pole diagram) at a notch frequency $F_N$. The phase of $H_{PY}$ undergoes an instant 180° phase shift at the notch frequency $F_N$. The transfer function $H_{LF}$ of the loop filter 140 of the sigma-delta ADC 102 is according to the following equation (1):

$$H_{LF} = \frac{c_1\omega_1 s + c_2\omega_1\omega_2}{s^2 + \omega_1\omega_2 d} \quad (1)$$

which represents one zero and one complex conjugate pole combination. The transfer function $H_{PY}$ from the PRBS signal to the output DOUT is according to the following equation (2):

$$H_{PY} = \frac{1}{1 + DAC_{gain} * H_{LF}} \quad (2)$$

where $DAC_{gain}$ is the gain of the DAC 133, which is 1 in the illustrated embodiment. $H_{PY}$ may also be referred to as the Noise Transfer Function (NTF) of the sigma-delta ADC 102.

It is noted that each tone signal TN injected into the conversion path of the sigma-delta ADC 102 follows the same transfer function as the PRBS signal, especially since injected at the same location. When the resonant frequency of the loop filter 140 is modified, the level of each tone signal TN is correspondingly modified in accordance with the transfer function. In particular, as the resonant frequency changes, the notch frequency increases or decreases and the tone level changes accordingly. The loop filter 140 may be pre-calibrated in which multiple tones may be injected one at a time or in parallel during a test procedure in which the corresponding tone levels may be measured. These measured tone levels may be considered expected tone levels that are empirically determined and stored. This information may then be used as a metric to calibrate the sigma-delta ADC 102 during operation as further described herein.

Figure 3:
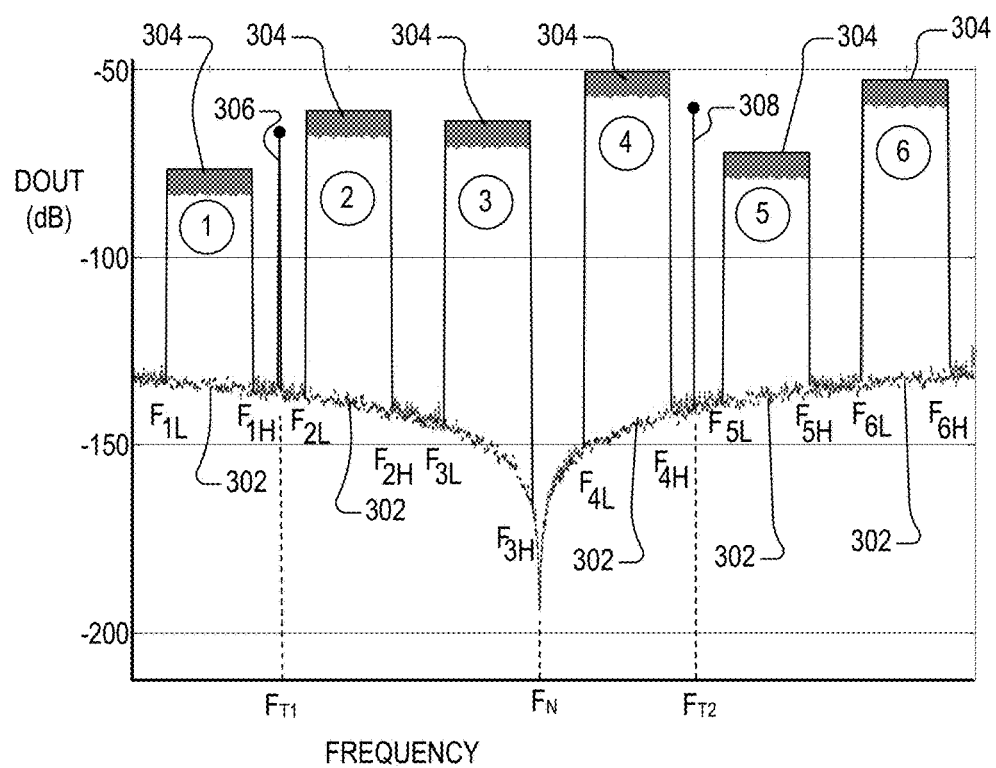
FIG. 3 is a graphic diagram plotting the output spectrum of DOUT versus frequency for the sigma-delta ADC of FIG. 1 according to one embodiment of the present disclosure.

FIG. 3 is a graphic diagram plotting the output spectrum of DOUT (shown roughly as signal power measured in dB) versus frequency for the sigma-delta ADC 102 according to one embodiment of the present disclosure. A first curve 302 illustrates DOUT without an input signal, and a second response curve 304 illustrates DOUT with a multiple channel input signal with non-signal frequency gaps or spaces between channels. The first curve 302 develops a notch at about the notch frequency $F_N$. In addition, a first spike represents a first tone 306 injected at a first tone frequency $F_{T1}$, and a second spike represents a second tone 308 injected at a second tone frequency $F_{T2}$. In a non-limiting specific embodiment using the specific radian and gain units previously described along with AIN provided as a 100 kHz sine wave (e.g., $F_{IN}=100$ kHz), the notch 304 occurs at a notch frequency $F_N$ of about 223.5 kHz, $F_{T1}$ is at about 205 kHz, and $F_{T2}$ is at about 235 kHz.

The first tone 306 and the second tone 308 are generated at different frequencies in which each is generated at a corresponding frequency that is outside the frequency range of each of the operating frequency channels, meaning within selected ones of the non-signal frequency gaps. Thus, the first and second tones 306 and 308 may be used when the sigma-delta ADC 102 is actively processing Ain. As shown, for example, the input signal includes channels 1, 2, 3, 4, 5, and 6 (among several other channels, not shown) in which each channel is between a low frequency level and a high frequency level. As shown, channel 1 is between frequencies $F_{1L}$ and $F_{1H}$, channel 2 is between frequencies $F_{2L}$ and $F_{2H}$, channel 3 is between frequencies $F_{3L}$ and $F_{3H}$, channel 4 is between frequencies $F_{4L}$ and $F_{4H}$, channel 5 is between frequencies $F_{5L}$ and $F_{5H}$, and channel 6 is between frequencies $F_{6L}$ and $F_{6H}$. The high frequency level of each frequency channel is less than the low frequency level of the next higher frequency channel leaving the frequency gaps between the channels. The first tone 306 is shown positioned between channels 1 and 2 in which $F_{T1}$ is between frequencies $F_{1H}$ and $F_{2L}$, and the second tone 308 is shown positioned between channels 4 and 5 in which $F_{T2}$ is between frequencies $F_{4H}$ and $F_{5L}$. In one embodiment, the tones 306 and 308 are implemented in a sufficiently clean manner with reduced noise so that they do not otherwise interfere with the output signal and thus do not interfere with normal operation of the sigma-delta ADC 102.

It is appreciated that the tones 306 and 308 may each be located at different candidate locations in the frequency gaps between the operative channels so long as not within the frequency ranges of any of the channels. For example, the first tone 306 may alternatively be located just below $F_{1L}$ and thus between channel 1 and the next lower frequency channel (if any) or between channels 2 and 3 and thus between the frequencies $F_{2H}$ and $F_{3L}$. In a similar manner, the second tone 308 may alternatively be located between channels 3 and 4, or between channels 5 and 6, or between channel 6 and the next higher frequency channel (if any), or the tone frequency may be higher than the highest frequency channel. The selected tone frequencies $F_{T1}$ and $F_{T2}$ are exemplary only and may be below, above or between other ones of the non-signal channel or frequency gaps. In addition, each tone frequency may be adjusted within a selected frequency gap if tone detection is noisy or if it is desired to achieve better confidence of tone detection. For example, the illustrated frequency $F_{T1}$ of the first tone 306 may be adjusted downwards towards $F_{1H}$ or upwards towards $F_{2L}$, or the illustrated frequency $F_{T2}$ of the second tone 308 may be adjusted downwards towards $F_{4H}$ or upwards towards $F_{5L}$, or a combination of both. The same is true for a tone located in any of the other frequency gaps. It is also possible that both tones be located on the same side of the notch frequency $F_N$, such as both below $F_N$ or both above $F_N$. It has been determined, however, that more accurate calibration results may be achieved using a pair of tones on either side of the notch frequency $F_N$ as shown by the illustrated embodiment.

Each of the possible tone frequencies for a given configuration may be determined and generated and empirically measured for a given configuration or implementation. For example, the level or amplitude of each generated tone may be isolated and measured or estimated and stored, and then a corresponding tone level ratio may be calculated or otherwise determined for each tone pair. This process may be done for each possible tone pair combination, such as a first set of tone level ratios for the first tone 306 between channels 1 and 2 with the second tone 208 located between channels 3 and 4, between channels 4 and 5, between channels 5 and 6, etc., a second set of tone level ratios for the first tone 306 between channels 2 and 3 with the second tone 208 located between channels 3 and 4, between channels 4 and 5, between channels 5 and 6, etc., and so on. The full set of tone level ratios may then be stored in a memory, such as a lookup table (LUT) or the like, in which the stored tone level ratios may be referred to as the expected tone level ratios. The expected tone level ratios may be determined and stored beforehand or prior to operation, or may be determined and stored or updated during operation.

In one embodiment, multiple tone levels may be determined within each frequency gap along with corresponding tone level ratios between each pair of tones. Alternatively, for configurations in which the frequency gaps are relatively small, a single tone level may be determined within each gap in which small tone frequency adjustments within each gap may not appreciably change the corresponding tone level. In another embodiment, linear interpolation may be used for tone frequency adjustments within the frequency gaps. Additional tone levels and corresponding tone level ratios may also be determined and stored for performing calibration at start-up (e.g., before AIN is applied) or during any idle periods when the sigma-delta ADC 102 is not actively processing AIN.

As described further herein, during operation of the digital conversion system 100, calibration is performed by selecting and generating a particular tone pair combination, measuring a corresponding tone level ratio, and comparing the measured tone level ratio with a corresponding expected tone level ratio to determine an error value. The error value may then be used to adjust an operating frequency of the sigma-delta ADC 102 for calibration as further described herein. Calibration may be performed in a continuous manner or on a periodic basis as often as deemed necessary for a given configuration.

Figure 4:
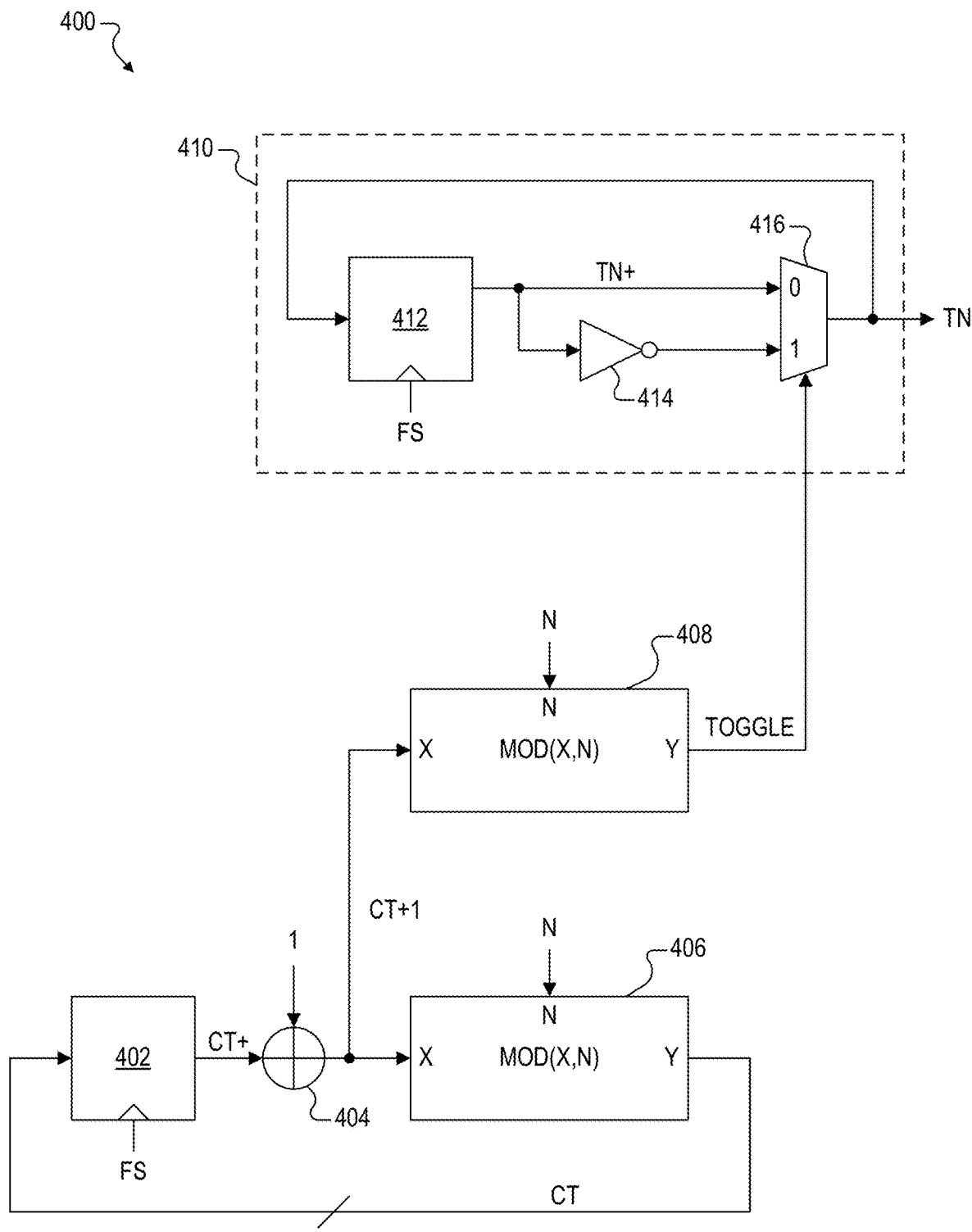
FIG. 4 is a simplified block diagram of a tone generator that may be used as, or within, the tone generator of FIG. 1 for generating a single tone signal according to one embodiment of the present disclosure.

FIG. 4 is a simplified block diagram of a tone generator 400 that may be used as, or within, the tone generator 142 for generating a single tone signal TN according to one embodiment of the present disclosure. The tone generator 400 includes a multibit register 402 clocked by FS, an adder 404, a modulo block 406, a comparator 408, and a bit inverter 410. The bit inverter 410 includes a 1-bit register 412 clocked by FS, an inverter 414, and a 2-input multiplexer (MUX) 416. The register 402 stores a multibit count value CT+ that may include one or more fractional bits. In one embodiment, for example, CT+ may include 3 fractional bits for storing a fractional value as a multiple of $\frac{1}{8}^{th}$ (e.g., to implement fractional values of 0.125, 0.25, 0.375, 0.5, 0.625, 0.75, 0.875). More or less fractional bits may be included in alternative embodiments. The register 402 is clocked by the sample frequency clock FS in which the output value CT+ is updated by an input value CT with each cycle of FS. The adder 404 increments CT+ at the output of the register 402 by adding 1 to CT+ to output CT+1, which is provided to an input of the modulo block 406 and to an input of the comparator 408. The modulo block 406 receives a value N which is a half period value of a target tone frequency based on FS. For example, if FS=100 MHz and the target tone frequency is 17.4 MHz, then the half period is about 2.8736. If N is limited to 3 fractional bits, then the closest value for N is 2.875. The modulo block 406 performs the modulo function CT=MOD(CT+1, N). CT+ is incremented by 1 to CT+1 for each cycle of FS, and when CT+1 exceeds N, then the modulo block 406 subtracts N from CT+1 to output CT which is stored back into the register 402 in the next cycle of FS.

The comparator 408 outputs a TOGGLE bit that toggles between 0 and 1 each time CT+1 equals to exceeds N. TOGGLE is provided to a select input of the MUX 416, having an output providing the 1-bit tone signal TN. TN is fed back to an input of the register 412 having an output providing a value TN+, which is clocked by FS so that the register 412 is updated with the value of TN for each cycle of FS. The register 412 outputs a value TN+, which is provided to the logic "0" input of the MUX 416 and to the input of the inverter 414. The output of the inverter 414 is provided to the logic "1" input of the MUX 416.

Figure 5:
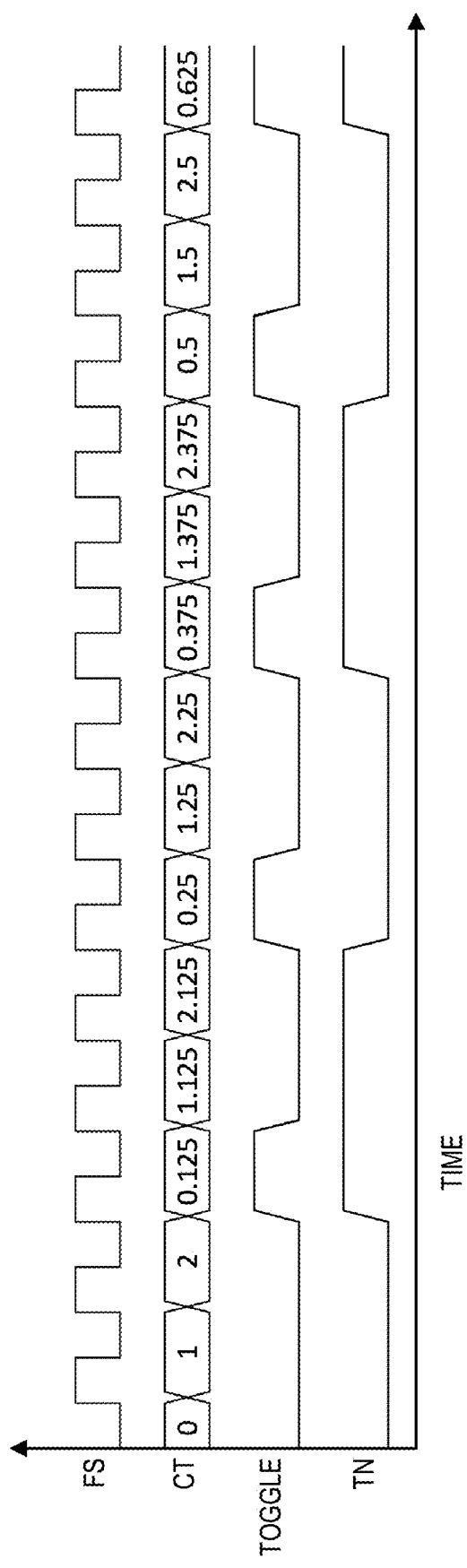
FIG. 5 is a timing diagram plotting signals FS, CT, TOGGLE, and TN for illustrating operation of the tone generator of FIG. 4 according to one embodiment of the present disclosure.

FIG. 5 is a timing diagram plotting signals FS, CT, TOGGLE, and TN for illustrating operation of the tone generator 400 according to one embodiment of the present disclosure. CT, TOGGLE, and TN are each initialized to 0. CT+, and thus CT, is incremented with each rising edge of FS until CT+1 is incremented above N. For N=2.875, when CT+1 is incremented to 3, the modulo block 406 subtracts N from 3 so that CT decreases to 0.125. Also, the comparator 408 transitions TOGGLE to 1 so that the MUX 416 is switched to the output of the inverter 414 so that TN transitions from 0 to 1. In the next cycle of FS, CT increments to 1.125, TN+ transitions to 1 and TOGGLE goes back to 0 so that TN remains at 1. In the next cycle of FS, CT increments to 2.125 which is less than N so that TOGGLE and TN remain unmodified. In the next cycle of FS, since CT+1=3.125 which is greater than N, the modulo block 406 subtracts N from CT+1 so that CT is reduced to 0.25. Also, the comparator 408 transitions TOGGLE high so that the MUX 416 transitions TN back to 0. In the next cycle of FS, CT increments to 1.25, TN+ transitions to 0 and TOGGLE goes back to 0 so that TN remains at 0. Operation continues in this manner so that TN operates at a frequency of FS/2N or about 17.391 MHz which is substantially close to the target tone frequency of 17.4 MHz.

It is noted that for generating smaller frequencies, such as 205 kHz and 235 kHz as shown in FIG. 3, N has a sufficient number of bits for both integer and fractional values. The half period for 205 kHz is about 243.902, so that 8 bits are needed for an integer value of 243 and 3 or more bits may be included to generate a fractional value sufficiently close to 0.902. Similarly, the half period for 235 kHz is about 212.766, so that 8 bits are sufficient for the integer value of 212 whereas 3 or more bits may be included to generate the fractional value sufficiently close to 0.766. For an actual configuration, the number of integer and factional bits for N are determined to generate each of the desired tone signals that may be used for calibration.

Figure 6:
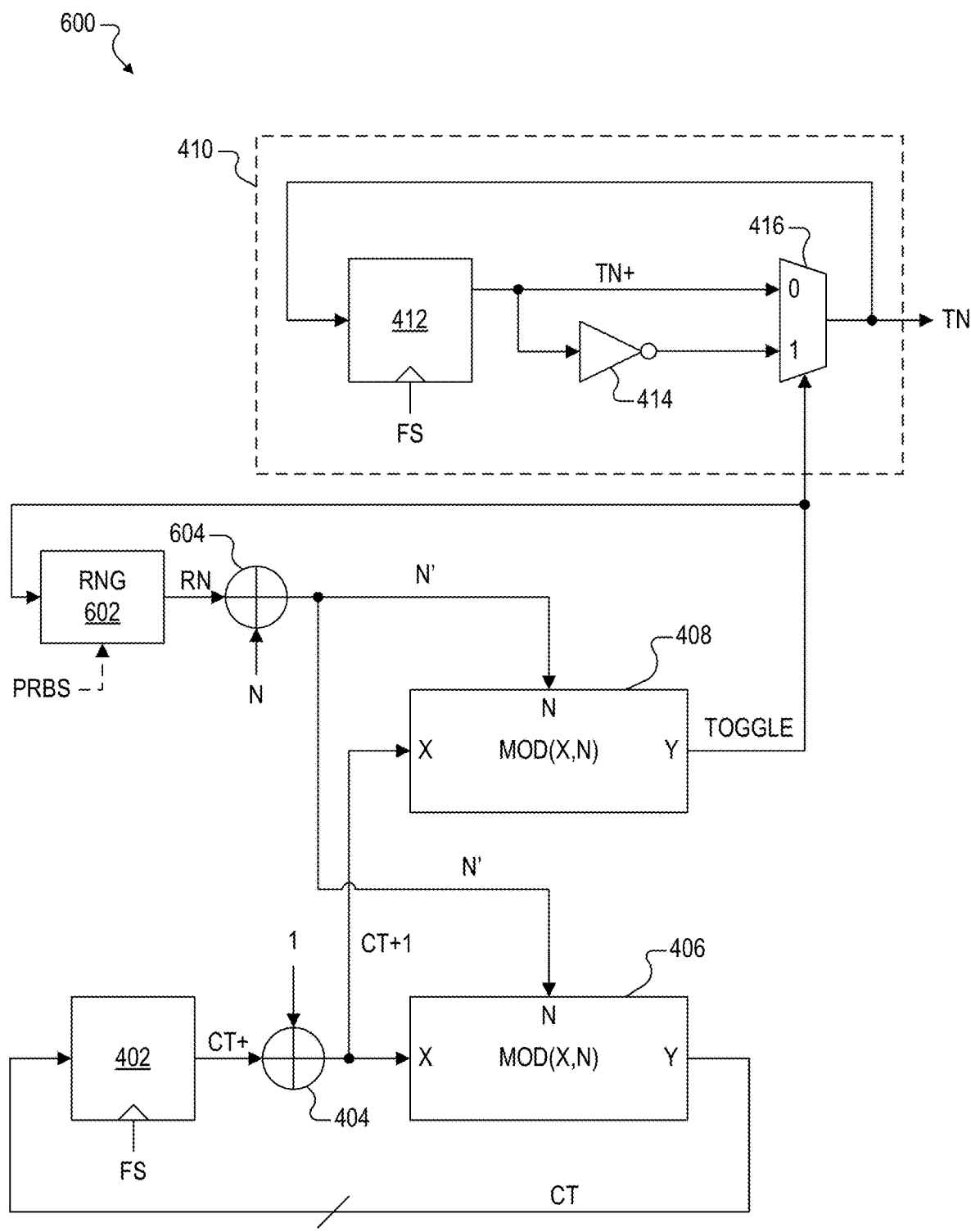
FIG. 6 is a simplified block diagram of a tone generator that may be used as, or within, the tone generator of FIG. 1 for generating the single tone signal TN according to another embodiment of the present disclosure.

FIG. 6 is a simplified block diagram of a tone generator 600 that may be used as, or within, the tone generator 142 for generating the single tone signal TN according to another embodiment of the present disclosure. The tone generator 600 is substantially similar to the tone generator 400 and also includes the multibit register 402, the adder 404, the modulo block 406, the comparator 408, and the bit inverter 410 coupled to operate in substantially the same manner. The tone generator 600, however, further includes a random number generator (RNG) 602 that outputs a random number RN to one input of an adder 604. It is understood that the random number RN generated by the RNG 602 may be a pseudo-random number rather than a true random number. The RNG 602 may also receive the TOGGLE signal, in which RN is updated to a new random number each time TOGGLE goes high. The adder 604 adds RN to N and outputs a randomized version of N, shown as N'. N' is instead provided to the N input of the modulo block 406 and the comparator 408.

In one embodiment, the RNG 602 is a separate generator for generating RN. In another embodiment, RNG 602 receives and converts RBS into RN. Again, every time the TOGGLE signal goes high, the RNG 602 calculates a new random number RN. In one embodiment, gaussian distributed floating point values are used with a standard deviation of 0.25. Other types of random generators are contemplated for lowering frequency spur tone as further described herein.

Figure 7:
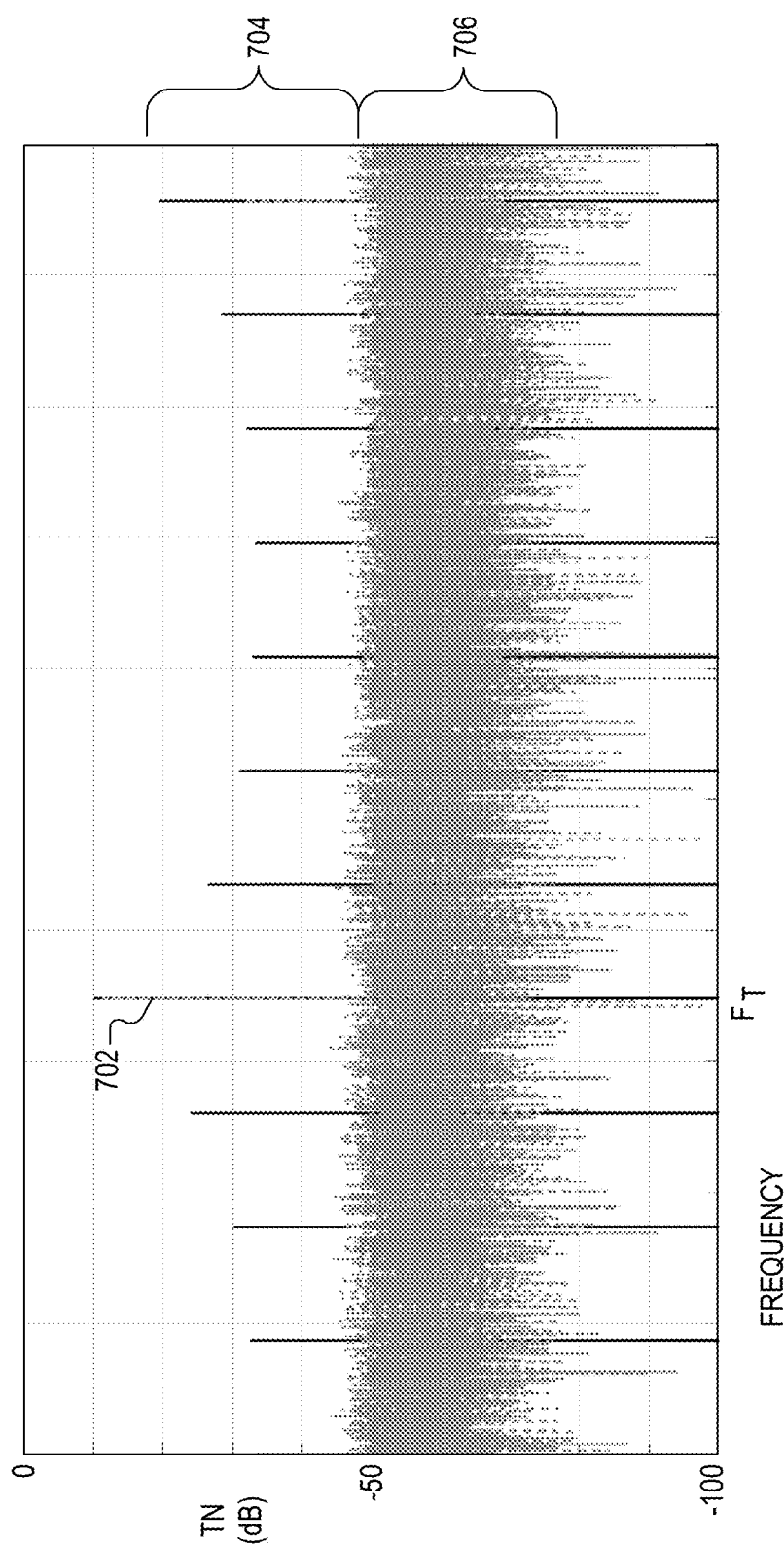
FIG. 7 is a graphic diagram plotting signal power of the tone signal TN versus frequency for both tone generators of FIGS. 4 and 6 according to one embodiment of the present disclosure.

FIG. 7 is a graphic diagram plotting signal power of the tone signal TN in dB versus frequency for both tone generators 400 and 600 according to one embodiment of the present disclosure. Both of the tone generators 400 and 600 generate a strong tone 702 at the target tone frequency FT. The tone generator 400, however, also tends to create strong spur tones generally shown at 704 at unwanted frequencies which may tend to interfere with the normal operation of the sigma-delta ADC 102. The tone generator 600 randomizes N to reduce or even eliminate the strong spurs tones 704. The tone generator 600 does generate additional randomized noise generally shown at 706, but the power level of the randomized noise 706 is sufficiently low so that it does not appreciably interfere with operation of the sigma-delta ADC 102.

Figure 8:
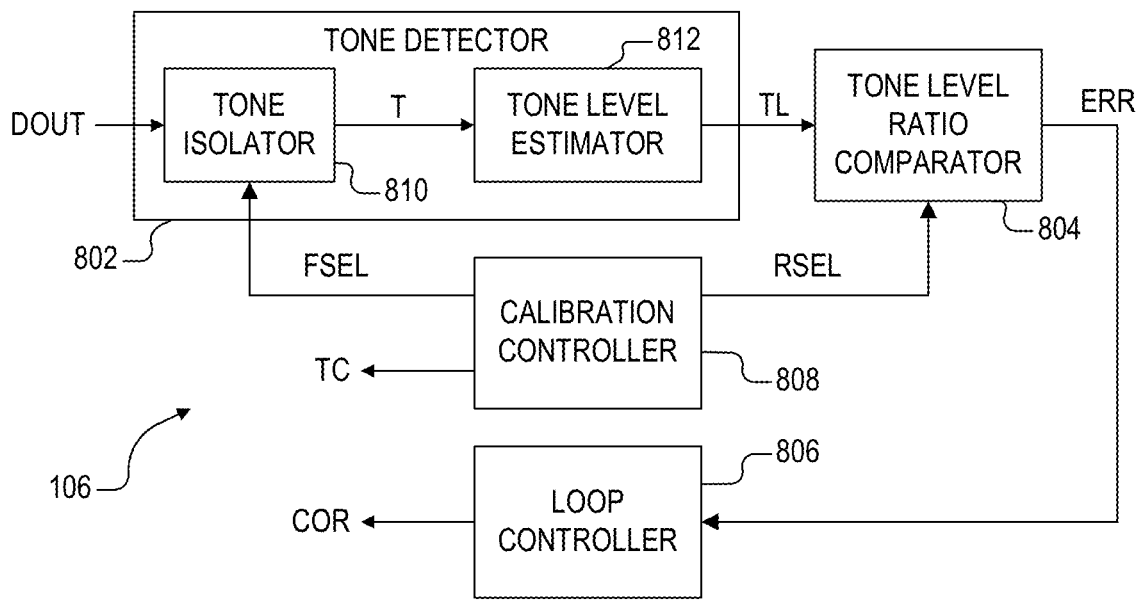
FIG. 8 is a simplified block diagram of the calibration circuitry of FIG. 1 implemented according to one embodiment of the present disclosure for a serial configuration.

FIG. 8 is a simplified block diagram of the calibration circuitry 106 implemented according to one embodiment of the present disclosure for a serial configuration. The calibration circuitry 106 includes a tone detector 802, a tone level ratio comparator 804, a loop controller 806, and a calibration controller 808. DOUT is provided to an input of the tone detector 802, which isolates and estimates a tone level (TL) for a target tone injected into the conversion path of the sigma-delta ADC 102. The tone level TL is provided to an input of the tone level ratio comparator 804, which divides a selected pair of tone levels to determine a measured tone level ratio and that compares the measured tone level ratio with an expected tone level ratio to determine an error value ERR. The ERR value is provided to an input of the loop controller 806, which converts the ERR value to the correction signal COR used to adjust a resonant frequency of the loop filter 140 of the sigma-delta ADC 102 as previously described. When the measured tone level ratio substantially matches the expected tone level ratio, then ERR is minimized or otherwise decreases to zero and the sigma-delta ADC 102 is considered calibrated.

The calibration controller 808 asserts the tone control signal TC to the tone generator (such as either one of the tone generators 400 or 600) to select a tone frequency for each of one or more tones to be injected into the sigma-delta ADC 102. For example, the TC signal may provide one or more N values to the tone generator 142 for generating the desired one or more tones at corresponding tone frequencies. The calibration controller 808 also asserts a frequency select signal FSEL that identifies the frequency of each injected tone. In one embodiment, the FSEL signal includes a digital (multibit) value that identifies the frequency of an injected tone. The calibration controller 808 further asserts a ratio select signal RSEL to the tone level ratio comparator 804 to select a corresponding expected tone level ratio used for comparison with the measure tone level ratio. In a serial embodiment, the tone generator 142 may generate only one tone at a time in which the tone level ratio comparator 804 stores a tone level of a first measured tone level and then determines a measured tone level ratio in response to receiving a second measured tone level. In a parallel embodiment, the tone generator 142 is configured to generate multiple tones at a time in which the tone detector 802 is configured to isolate and estimate each of the injected tones incorporated into DOUT. The tone level ratio comparator 804 determines the measured tone level ratio using the pair of tones for comparison with the expected tone level ratio. The serial embodiment is less complex but consumes additional time for each calibration, whereas the parallel embodiment is more complex but provides faster calibration.

In one embodiment the tone detector 802 includes a tone isolator 810 and a tone level estimator 812. The tone isolator 810 receives FSEL that identifies the frequency of the generated tone signal, in which the identified tone frequency is used to isolate a target tone from the DOUT signal and to provide a corresponding tone signal T to an input of the tone level estimator 812. In an alternative embodiment, the tone(s) TN(S) generated by the tone generator 142 may be provided to the tone isolator 810 rather than FSEL, in which the tone isolator 810 is modified accordingly. The tone level estimator 812 estimates the amplitude or level of the isolated tone to provide a tone level TL value to the tone level ratio comparator 804. The tone detector 802 is generally configured to handle one tone at a time for serial embodiments in which multiple tone detectors 802 are provided to process multiple tones (e.g., 2 tones) at a time for parallel embodiments.

Figure 9:
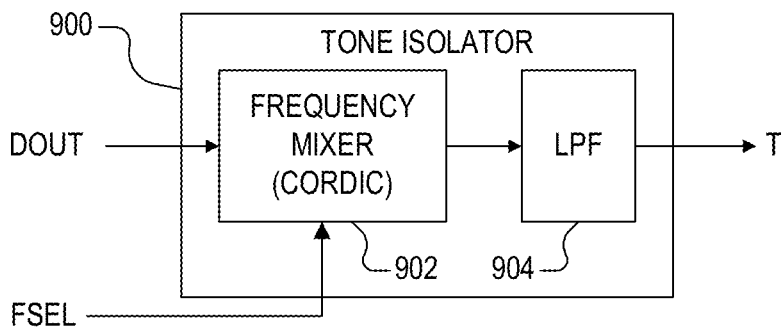
FIG. 9 is a simplified block diagram of a tone isolator implemented according to one embodiment of the present disclosure that may be used as the tone isolator of FIG. 8.

FIG. 9 is a simplified block diagram of a tone isolator 900 implemented according to one embodiment of the present disclosure that may be used as the tone isolator 810. The tone isolator 900 includes a frequency mixer 902 receiving FSEL and a low pass filter (LPF) 904. The frequency mixer 902 mixes DOUT with a negative target tone frequency –FT to shift or down convert the whole spectrum including shifting down the frequency of the injected tone TN to at or near zero Hz. The LPF 904 may have a narrow bandwidth around DC to isolate the target tone to a direct-current (DC) level value, such as a corresponding voltage level. In one embodiment, for example, the LPF 904 has a bandwidth of about 10 Hz. The tone level estimator 812 then converts the DC level value provided by the frequency mixer 902 to a corresponding numeric value TL indicating the corresponding tone level, which is provided to the tone level ratio comparator 804. In one embodiment, the frequency mixer 902 is configured as a COordinate Rotation Digital Computer (CORDIC) for down converting the tone frequency to at or near DC.

Figure 10:
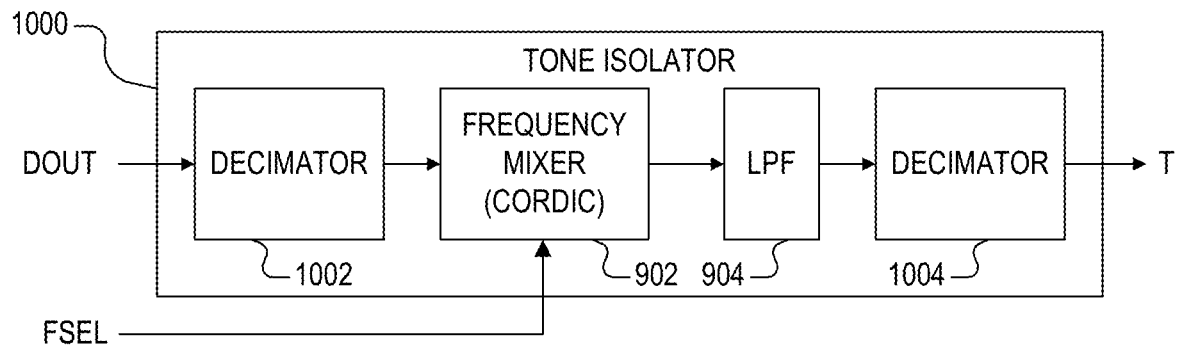
FIG. 10 is a simplified block diagram of a tone isolator implemented according to another embodiment of the present disclosure that may be used as the tone isolator of FIG. 8.

FIG. 10 is a simplified block diagram of a tone isolator 1000 implemented according to another embodiment of the present disclosure that may be used as the tone isolator 810. The tone isolator 1000 is similar to the tone isolator and also includes the frequency mixer 902 and the LPF 904. In addition, the tone isolator 1000 includes at least one decimator, such as either or both of an input decimator 1002 and an output decimator 1004. The input decimator 1002, if included, reduces the sample rate of DOUT to provide a reduced sample rate DOUT signal to the frequency mixer 902. The output decimator 1004, if included, reduces the sample rate of the signal at the output of the LPF 904 for reducing the sample rate of the tone signal T provided to the tone level estimator 812. Each decimator provides a sample rate reduction to save power and area consumption. Each decimator may typically include a low pass filter to remove unwanted aliasing components before sample rate reduction.

Figure 11:
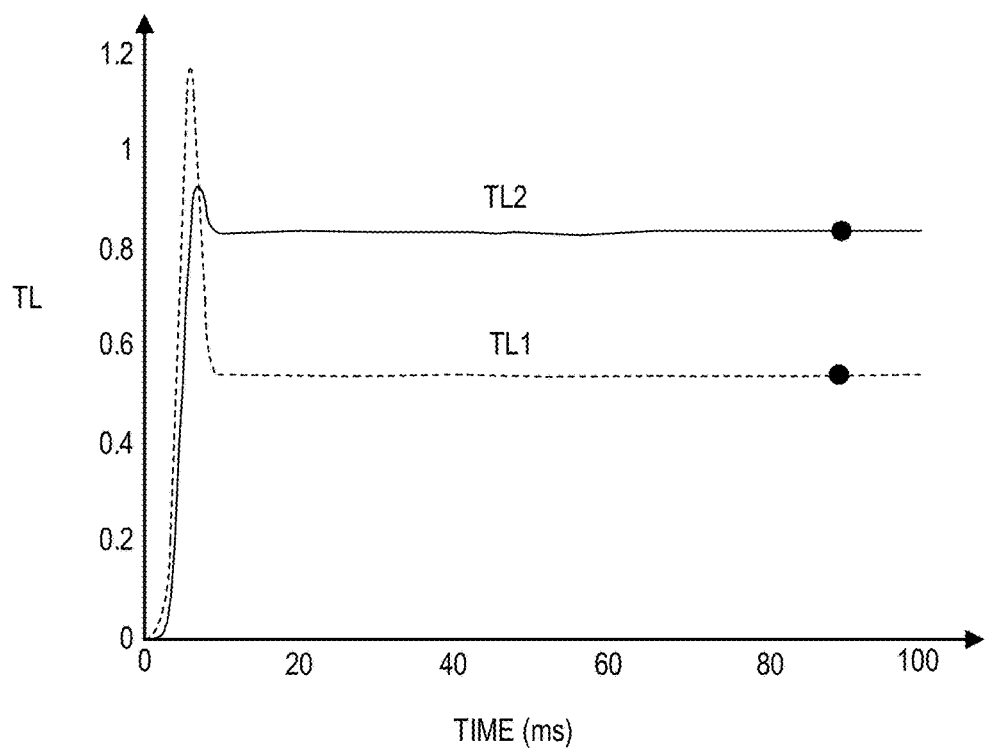
FIG. 11 is a graphic diagram plotting tone level values for a pair of tones shown as TL1 and TL2 versus time illustrating operation of the of the tone level estimator of FIG. 8 according to one embodiment of the present disclosure.

FIG. 11 is a graphic diagram plotting normalized tone level (TL) values for a pair of tones shown as TL1 (plotted using dashed line) and TL2 versus time in milliseconds (ms) illustrating operation of the of the tone level estimator 812 according to one embodiment of the present disclosure. The output of the tone isolator 810 (configured in any suitable manner including the tone generators 900 or 1000) is a tone level that settles over time to a steady state value. As shown for a particular embodiment, the tone level for a provided tone settles to a level after about 20 ms in which a sample of each tone may be taken between about 80 ms to 100 ms (e.g., at about 90 ms). Although two one levels TL1 and TL2 are shown, the tone level estimator 812 is configured to estimate one tone at a time. The timing may vary from one configuration to another in which optimal timing may be empirically determined. The tone level estimator 812 outputs an estimated tone level TL for each tone to the tone level ratio comparator 804, shown at TL1 for a first tone and TL2 for a second tone. For a serial configuration, the tones are generated, isolated, and estimated one at a time. For a parallel configuration, multiple tones (e.g., 2 tones) are generated, isolated, and estimated together in which a separate tone detector 802 and corresponding tone level estimator 812 are provided for each injected tone.

Figure 12:
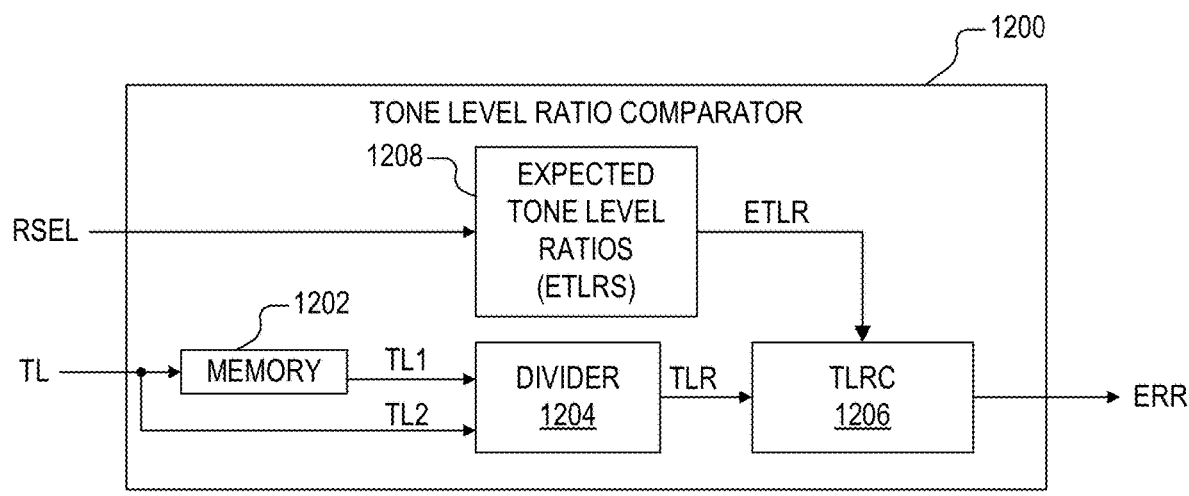
FIG. 12 is a simplified block diagram of a tone level ratio comparator implemented according to one embodiment of the present disclosure that may be used as the tone level ratio comparator of FIG. 8 for a serial configuration.

FIG. 12 is a simplified block diagram of a tone level ratio comparator 1200 implemented according to one embodiment of the present disclosure that may be used as the tone level ratio comparator 804 for a serial configuration. The tone level ratio comparator 1200 includes a memory 1202, a divider 1204, a tone level ratio comparator (TLRC) 1206, and another memory 1208 for storing expected tone level ratios. The memories 1202 and 1208 are shown as separate blocks but the content may be stored into a common memory. Alternatively, the memory 1202 may be implemented as a set of latches or flip-flops or a register or the like whereas memory 1208 may be implemented as random access memory (RAM) or read-only memory (ROM). The expected tone level ratios may be predetermined and stored in any suitable manner, such as a lookup table (LUT) or the like, or they may be computed or otherwise updated in real time according to equation (2). The tone level value TL is provided to an input of the memory 1202 having an output providing the stored TL to one input of the divider 1204. TL is also provided to a second input of the divider 1204. For a serial configuration in which only one tone is injected at a time, the first TL value, or TL1, is stored in the memory 1202 and provided to the first input of the divider 1204. The second TL value, or TL2 is provided to the second input. In an alternative embodiment, both TL1 and TL2 may be temporarily stored in the memory 1202 and provided together to the respective inputs of the divider 1204.

The divider 1204 divides the tone levels TL1 and TL2 to output a corresponding tone level ratio to an input of the TLRC 1206. RSEL selects a corresponding one of the expected tone level ratios stored in the memory 1208 to provide an expected tone level ratio (ETLR) to another input of the TLRC 1206. The TLRC 1206 compares the measured TLR with the expected ETLR to generate the ERR signal. It is noted that the measured TLR and the expected tone level ratios stored in the memory 1208 may be according to either TL1/TL2 or TL2/TL1 so long as consistent with each other.

Figure 13:
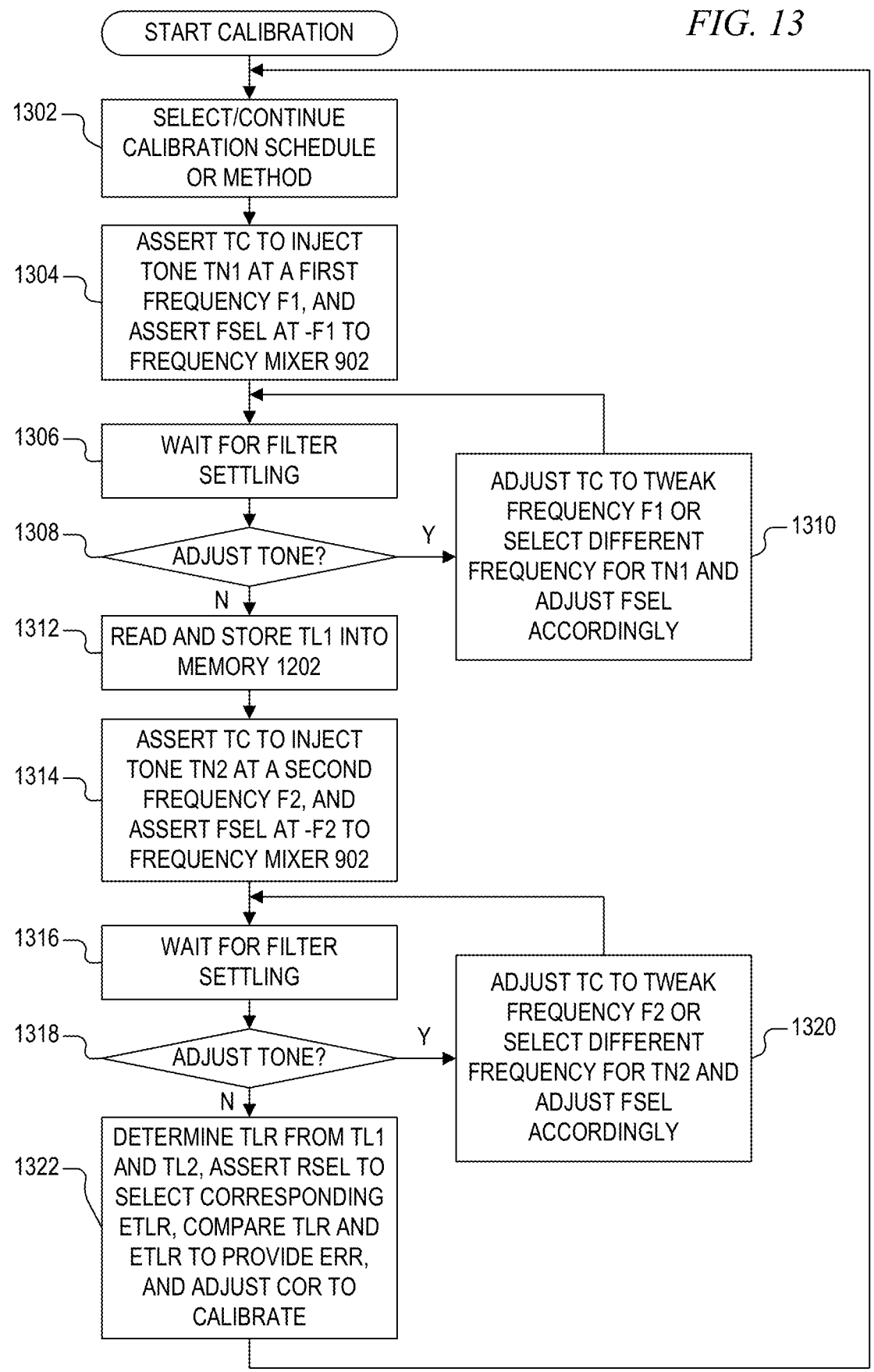
FIG. 13 is a flowchart diagram illustrating operation of the calibration circuitry of FIG. 1 for a serial configuration according to one embodiment of the present disclosure.

FIG. 13 is a flowchart diagram illustrating operation of the calibration circuitry 106 for a serial configuration according to one embodiment of the present disclosure. At a first block 1302, a calibration schedule or method is selected or otherwise continued. For example, the calibration process may be continuous or non-stop in which a next calibration process is initiated immediately after completion of the last calibration process. Alternatively, the calibration process may be performed on a periodic basis using a predetermined or programmed timeout period for initiating the next calibration process. In addition or in the alternative, each calibration may be initiated in response to a predetermined or programmed event, such as a temperature change by a predetermined amount or when temperature reaches one or more predetermined temperature levels. A combination of calibration methods may be employed, such as calibration when temperature changes by a predetermined amount or reaches any of multiple temperature levels and after timeout of a maximum period between calibration procedures.

Operation advances to a next block 1304 in which the calibration controller 808 asserts TC to control the tone generator 142 to inject a first tone TN1 at a first frequency F1. The calibration controller 808 or the tone generator 142 also asserts FSEL to −F1 to the frequency mixer 902 for isolating the injected first tone TN1 in DOUT. It is noted that FSEL may be or otherwise include a digital value that simply identifies the frequency F1 (rather than −F1) in which it is understood that the frequency mixer 902 shifts the spectrum of DOUT down by −F1 so that the tone is shifted to at or near zero. Operation then advances to next block 1306 in which the calibration controller 808 waits for filter settling by the tone isolator 810 for the tone level estimator 812 to take an accurate sample of the tone level of TL1. At next block 1308, it is queried whether to adjust the first tone TN1 if tone detection is noisy or if it is desired to achieve better confidence of tone detection. Various operating values or parameters may be monitored for making this determination, such as, for example, the variation (minimum−maximum, or standard deviation) on the level estimate signal.

If for any reason it is desired to adjust the first tone TN1, then operation advances to block 1310 in which TC is adjusted to tweak the frequency F1. F1 may be adjusted by any suitable amount to a frequency spot without an input signal or within the applicable frequency gap or to another frequency gap with an active input signal. As described in FIG. 3, for example, the frequency of the tone may be adjusted up or down (e.g., by any suitable amount without an active input or within a given frequency gap or a within a different selected frequency gap for an active input) depending upon operating conditions and the relative quality of tone detection. In addition, FSEL is adjusted accordingly to identify the actual frequency of the tone. Operation then returns to block 1306 to wait for filter settling by the tone isolator 810 for the tone level estimator 812 to take an accurate sample of the tone level TL1 of updated first tone TL1. Operation may loop between blocks 1306 and 1310 until an accurate sample of the first tone level TL1 is achieved for the first tone TN1.

When the first tone TN1 is sufficient and suitable first tone level TL1 is achieved, operation advances to block 1312 in which the tone level TL1 of the first tone TN1 encompassed within DOUT is stored into the memory 1202. Operation then proceeds to block 1314 in which the calibration controller 808 asserts TC to control the tone generator 142 to inject a second tone TN2 at a second frequency F2. The calibration controller 808 or the tone generator 142 also asserts FSEL to −F2 identify the second frequency F2 the frequency mixer 902 for isolating the injected second tone TN2 in DOUT. Operation then advances to next block 1316 in which the calibration controller 808 waits for filter settling by the tone isolator 810 for the tone level estimator 812 to take an accurate sample of the tone level of TL2. At next block 1318, it is queried whether to adjust the second tone TN2 if tone detection is noisy or if it is desired to achieve better confidence of tone detection in a similar manner as was done for the first tone.

If for any reason it is desired to adjust the second tone TN2, then operation advances to block 1320 in which TC is adjusted to tweak the frequency F2 in a similar manner as described for the first tone TN1. In addition, FSEL is adjusted accordingly. Operation then returns to block 1316 to wait for filter settling by the tone isolator 810 for the tone level estimator 812 to take an accurate sample of the tone level TL2 of the updated second tone TN2. Operation may loop between blocks 1316 and 1320 until an accurate sample of the second tone level TL2 is achieved for the second tone TN2.

When the second tone TN2 is sufficient and suitable second tone level TL2 is achieved, operation advances to block 1322 in which the divider 1204 divides TL1 and TL2 to determine the measured tone level ratio TLR, the calibration controller 808 asserts RSEL to select the expected tone level ratio (ETLR) stored in the memory 1208 that corresponds with the corresponding measured TLR, TLR and ETLR are compared by the TLRC 1206 to provide the error value ERR, and the loop controller 806 adjusted COR accordingly to calibrate the sigma delta ADC 102. Operation then loops back to block 1302 to continue the current calibration schedule or method or otherwise to select another calibration schedule or method.

Figure 14:
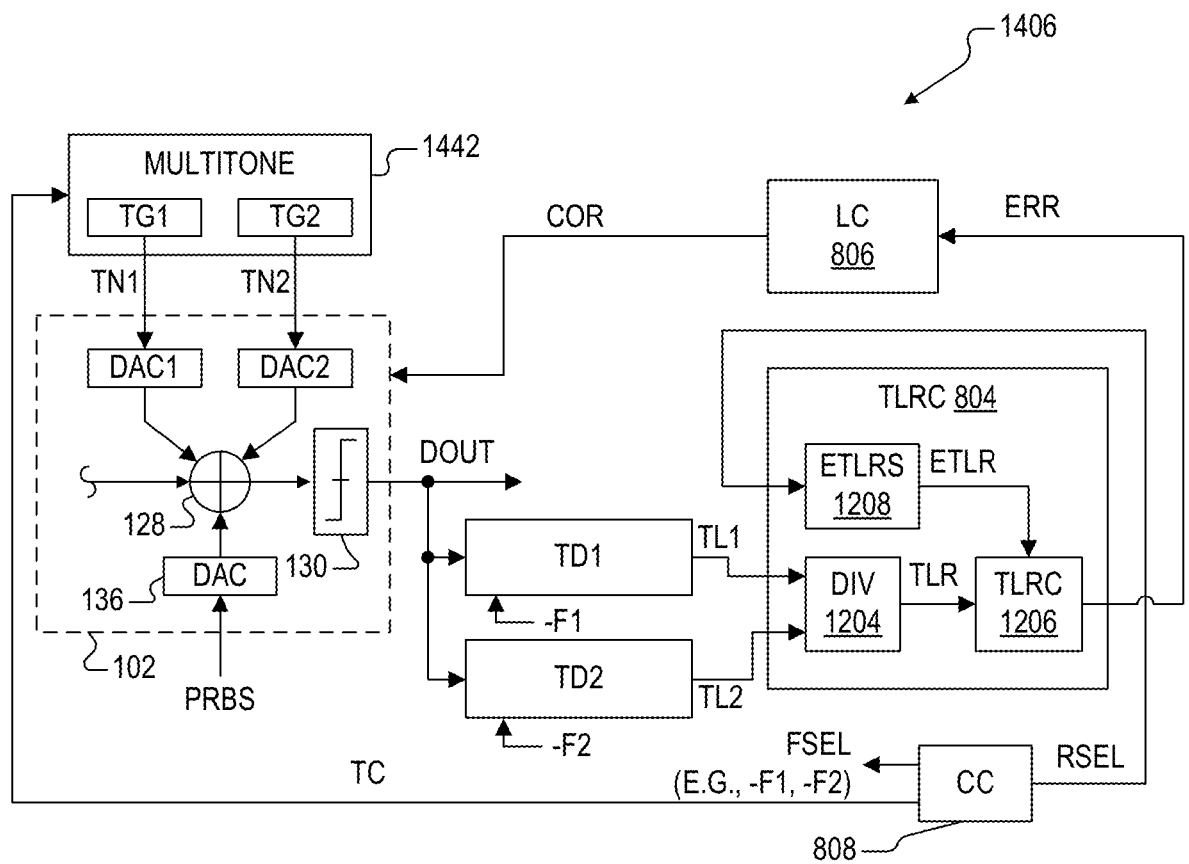
FIG. 14 is a simplified block diagram of calibration circuitry implemented according to another embodiment of the present disclosure for a parallel configuration for simultaneously injecting multiple tones into the conversion path of the sigma-delta ADC of FIG. 1.

FIG. 14 is a simplified block diagram of calibration circuitry 1406 implemented according to another embodiment of the present disclosure for a parallel configuration for simultaneously injecting multiple tones into the conversion path of the sigma-delta ADC 102. The calibration circuitry 1406 replaces the calibration circuitry 106 and a multitone generator 1442 replaces or is otherwise used as the tone generator 142. The calibration controller (CC) 808 is included and provides the tone control signal TC to the multitone generator 1442 for selecting multiple tones at a time, provides FSEL to provide the corresponding tone frequencies, and provides RSEL for selecting a corresponding expected tone level ratio. As shown, the multitone generator 1442 includes a first tone generator TG1 for generating a first tone TN1 provided through a first DAC1 to an input of the adder 128 and a second tone generator TG2 for generating a second tone TN2 provided through a second DAC2 to another input of the adder 128. The TC signal includes first and second N values for selecting the corresponding frequencies F1 and F2 of the tones TN1 and TN2. Each of the tone generators TG1 and TG2 may be configured in a similar manner as the tone generator 400 or the tone generator 600 for randomizing the N values. Although only two tones are shown generated and injected at a time, it is understood different embodiments may include any number of tone generators for injecting any suitable number of tones into the conversion path of the sigma-delta ADC 102 in parallel.

The calibration circuitry 1406 includes a first tone detector TD1 receiving −F1 from FSEL for detecting the first injected tone TN1 and a second tone detector TD2 receiving −F2 from FSEL for detecting the second injected tone TN2. As before, FSEL may include digital values that identify the actual frequencies F1 and F2 for use by the tone detectors TD1 and TD2 as previously described. It is noted that if more than two tones are simultaneously generated and injected, then a corresponding number of tone detectors may be included. Each of the tone detectors TD1 and TD2 may be implemented in a similar manner as the tone detector 802 previously described, in which TD1 provides a first tone level value TL1 for the first tone TN1 and TD2 provides a second tone level value TL2 for the second tone TN2. The tone level values TL1 and TL2 are provided to respective inputs of the divider 1204 of the tone level ratio comparator (TLRC) 804, which outputs the corresponding TLR value to the TLRC 1206. It is noted that the memory 1202 may be omitted in the parallel configuration. In an alternative embodiment, the memory 1202 may be included in the parallel configuration for storing multiple tones at a time. RSEL is provided to the memory 1208 for providing the corresponding expected tone level ratio ETLR to the TLRC 1206. The TLRC 1206 performs the comparison and generates and outputs the ERR value to the loop controller (LC) 806, which provides the COR value to adjust the frequency of the sigma-delta ADC 102 for calibration.

Figure 15:
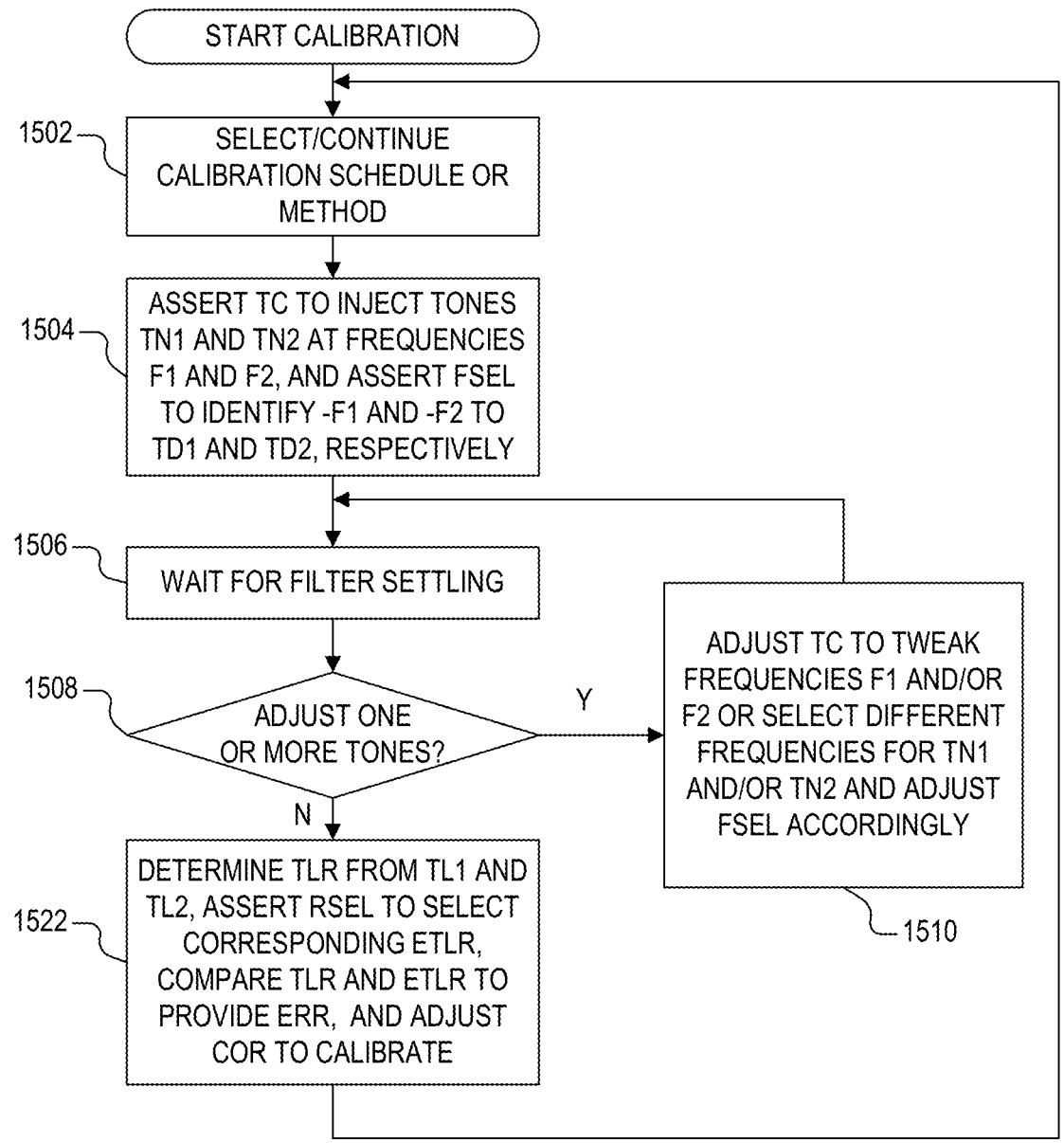
FIG. 15 is a flowchart diagram illustrating operation of the calibration circuitry of FIG. 4 for a parallel configuration according to one embodiment of the present disclosure.

FIG. 15 is a flowchart diagram illustrating operation of the calibration circuitry 1406 for a parallel configuration according to one embodiment of the present disclosure. At a first block 1502, a calibration schedule or method is selected or otherwise continued in a similar manner as described for the block 1302. Operation advances to a next block 1504 which is similar to the combination of the blocks 1304 and 1314 previously described. In this case, the calibration controller 808 asserts TC to control the tone generator 1442 to inject first and second tones TN1 and TN2 at first and second frequencies F1 and F2, and FSEL is asserted to identify −F1 and −F2 to the tone detectors TD1 and TD2, respectively. Operation then advances to next block 1506 in which the calibration controller 808 waits for filter settling by a tone isolator of each of the tone detectors for a tone level estimator to take an accurate samples of the tone levels TL1 and TL2. At next block 1508, it is queried whether to adjust either one or both of the tones TN1 and TN2 if tone detection is noisy or if it is desired to achieve better confidence of tone detection for either one or both tones. If for any reason it is desired to adjust either one or both tones TN1 and TN2, then operation advances to block 1510 in which TC is adjusted to tweak either or both of the frequencies F1 and F2 for each of the tones to be adjusted and to adjust FSEL accordingly for either or both tones. Operation then loops back to block 1506 to wait to filter settling and tone level reading. Operation may loop between blocks 1506 and 1510 until an accurate sample of each tone level is achieved.

When the first and second tones TN1 and TN2 are sufficient and suitable tone levels are achieved, operation advances to block 1522 in which the divider 1204 divides TL1 and TL2 to determine the measured tone level ratio TLR, the calibration controller 808 asserts RSEL to select the ETLR stored in the memory 1208 that corresponds with the corresponding measured TLR, TLR and ETLR are compared by the TLRC 1206 to provide the error value ERR, and the loop controller 806 adjusted COR accordingly to calibrate the sigma delta ADC 102. Operation then loops back to block 1502 to continue the current calibration schedule or method or otherwise to select another calibration schedule or method.

Figure 16:
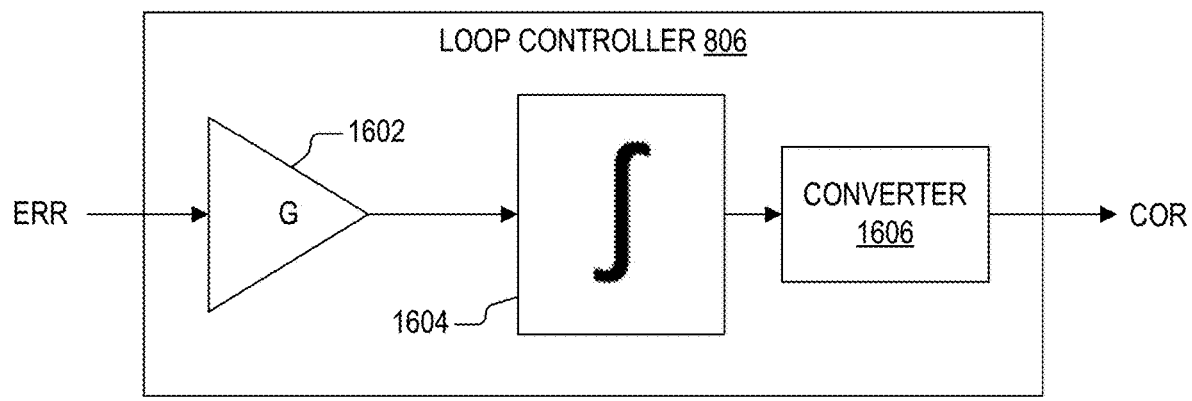
FIG. 16 is a simplified block diagram of the loop controller of FIG. 8 implemented according to one embodiment of the present disclosure.

FIG. 16 is a simplified block diagram of the loop controller 806 implemented according to one embodiment of the present disclosure. The loop controller 806 includes an amplifier 1602, an integrator 1604, and a converter 1606. The ERR signal is provided to an input of the amplifier 1602, having an output coupled to an input of the integrator 1604, having an output coupled to an input of the converter 1606, having an output providing the COR signal. The amplifier 1602 has a scalar gain G that may be used to adjust the gain of the control loop used for adjusting the resonant frequency of the loop filter 140. The integrator 1604 integrates the output of the amplifier 1602 for loop control. The converter 1606 converts the output of the integrator 1604 so that the COR signal has a scale and range suitable for the parameter being adjusted within the sigma-delta ADC 102 to adjust the notch frequency accordingly. In this manner, the COR signal adjusts a parameter within the sigma-delta ADC 102 to adjust the resonant frequency of the loop filter 140, which in turn adjusts the notch frequency to minimize the ERR signal.

The convergence time is dependent on the gain of the control loop as may be controlled by the gain of the amplifier 1602. The gain should be chosen such that the loop is sufficiently fast while also being sufficiently stable after settling. The gain value may depend on many parameters including, for example, ADC sampling rate, dither amplitude, potential blocker signals, etc. The control loop works such that after convergence the notch frequency $F_N$ is positioned at a target notch frequency.

Figure 17:
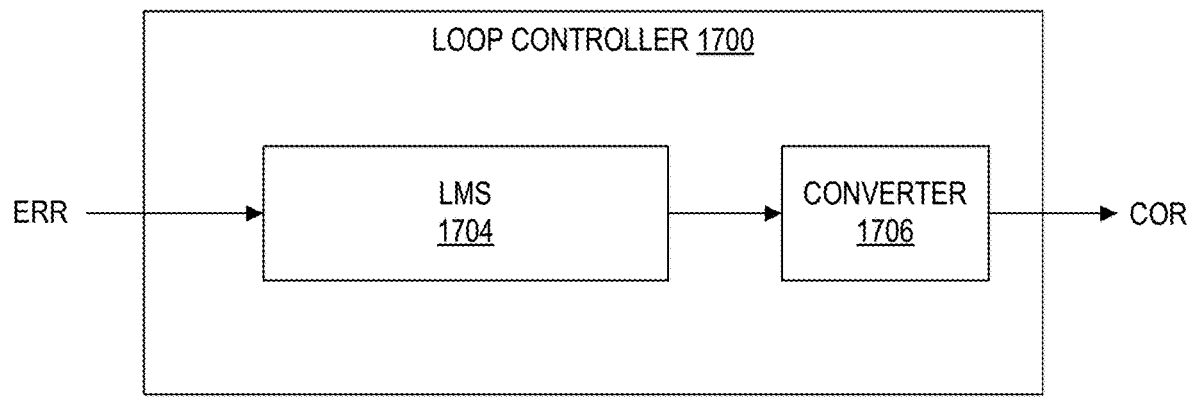
FIG. 17 is a simplified block diagram of a loop controller implemented according to another embodiment of the present disclosure which may be used as the loop controller of FIG. 8.

FIG. 17 is a simplified block diagram of a loop controller 1700 implemented according to another embodiment of the present disclosure which may be used as the loop controller 806. The loop controller 1700 is substantially similar in which the gain block 1602 and the integrator 1604 are replaced by an alternative function such as a least-mean square (LMS) block 1704 for controlling gain and loop operation. The converter 1606 is replaced by a similar converter 1706 that performs substantially the same function to convert the output of the LMS block 1704 into the COR signal.

Figure 18:
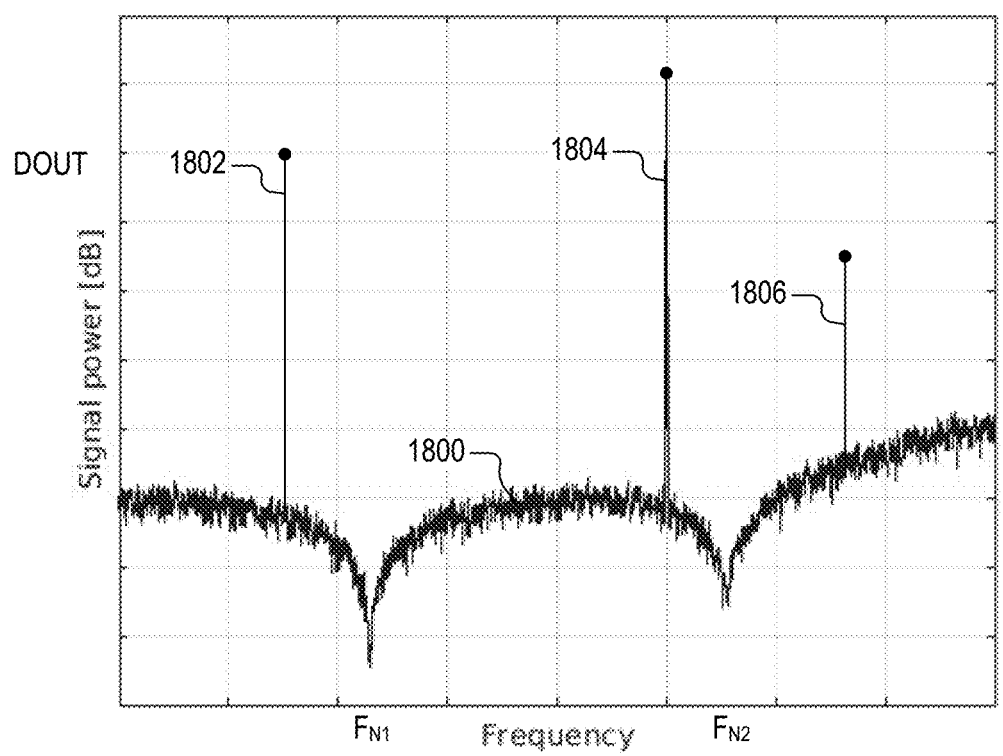
FIG. 18 is a graphic diagram plotting the output spectrum of DOUT versus frequency for a different, higher order converter (not shown) with two output frequency notches according to another embodiment of the present disclosure.

FIG. 18 is a graphic diagram plotting the output spectrum of DOUT (shown roughly as signal power measured in dB) versus frequency for a different, higher order converter (not shown) with two output notches at corresponding notch frequencies $F_{N1}$ and $F_{N2}$ according to another embodiment of the present disclosure. A curve 1800 illustrates DOUT without an input signal. Although an input signal is not shown, it is understood that the DOUT signal may include non-signal frequency gaps or spaces between channels in a similar manner as previously described when the input signal AIN is being actively processed. In accordance with a configuration with a single notch frequency $F_N$, a pair of tones may be generated and injected for detecting and calculating a tone ratio and for comparing the tone ratio to an expected tone ratio. When two notch frequencies $F_{N1}$ and $F_{N2}$ are included, rather than generating and injecting four separate tones including two tones per notch, a simplification may be made in which only three tones are generated and injected. As shown, for example, a first tone 1802 is generated and injected below the first notch $F_{N1}$, a second tone 1804 is generated and injected between the first and second notches, and a third tone 1806 is generated and injected above the second notch frequency $F_{N2}$. In this manner, a first tone ratio may be calculated using tones 1802 and 1804 for calibrating a first loop filter, and a second tone ratio may be calculated using tones 1804 and 1806 for calibrating a second loop filter.

Figure 19:
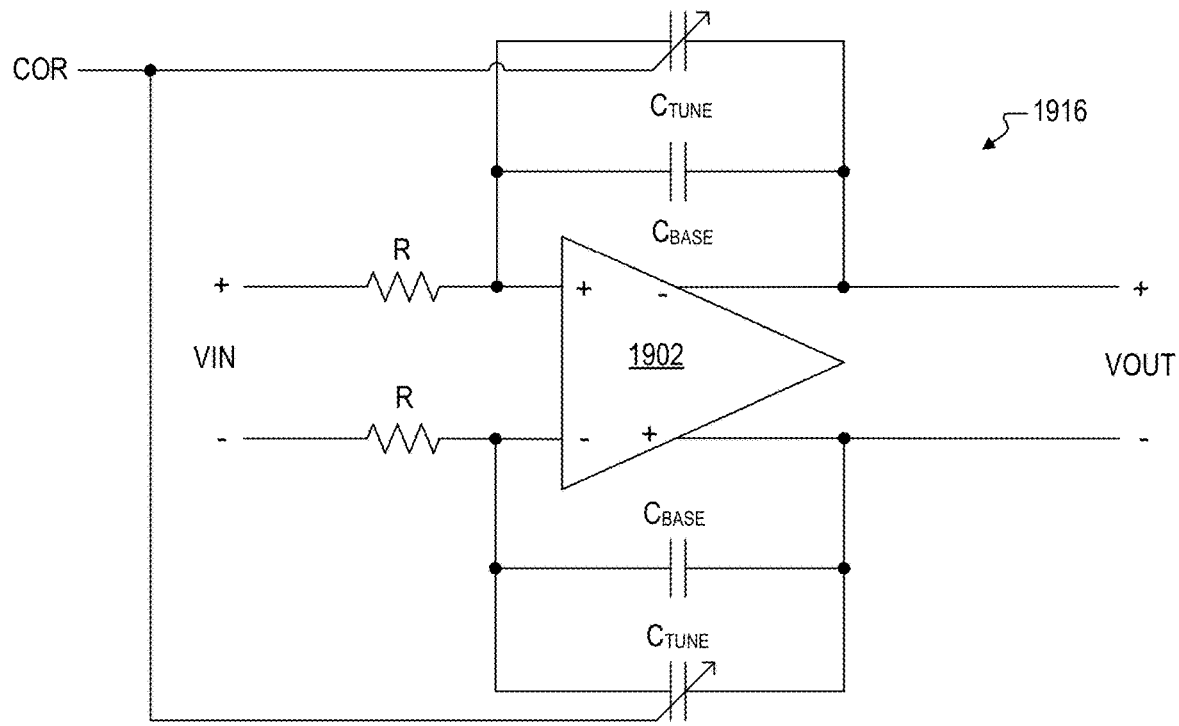
FIG. 19 is a schematic diagram of an integrator implemented according to one embodiment of the present disclosure that may be used as the integrator within the loop filter of FIG. 1.

FIG. 19 is a schematic diagram of an integrator 1916 implemented according to one embodiment of the present disclosure that may be used as the integrator 116 within the loop filter 140. The respective polarities of a differential input signal VIN are provided through a pair of input resistors each having a resistance R to respective inputs of a differential amplifier 1902. The differential amplifier 1902 has a differential output providing respective polarities of a differential output signal VOUT. Feedback circuitry including capacitors $C_{BASE}$ and $C_{TUNE}$ is coupled between both of the input polarities and output polarities of the amplifier 1902. The capacitor $C_{BASE}$ has a fixed capacitance coupled in parallel with the capacitor $C_{TUNE}$ having a variable capacitance that is adjusted by COR. COR may be used to adjust $C_{TUNE}$ for adjusting the overall gain of the integrator 116.

VOUT may be determined according to the following equation (3):

$$VOUT = \frac{1}{j\omega_1 R(C_{BASE} + C_{TUNE})} VIN \quad (3)$$

where $VOUT/VIN = \omega_1/s$ (in which "s" denotes the complex frequency domain in which $s = j\omega$).

The gain $\omega_1$ may be determined according to the following equation (4):

$$\omega_1 = \frac{-1}{R(C_{BASE} + C_{TUNE})} \quad (4)$$

In this manner, COR adjusts $C_{TUNE}$ which adjusts the gain $\omega_1$ of the integrator 1916, which in turn adjusts the resonant frequency of the loop filter 140. In addition or in the alternative, the integrator 118 may be configured in substantially the same manner as the integrator 1916 having a capacitor with adjustable capacitance $C_{TUNE}$ adjustable by COR for adjusting the gain $\omega_2$ of the integrator 118.

Figure 20:
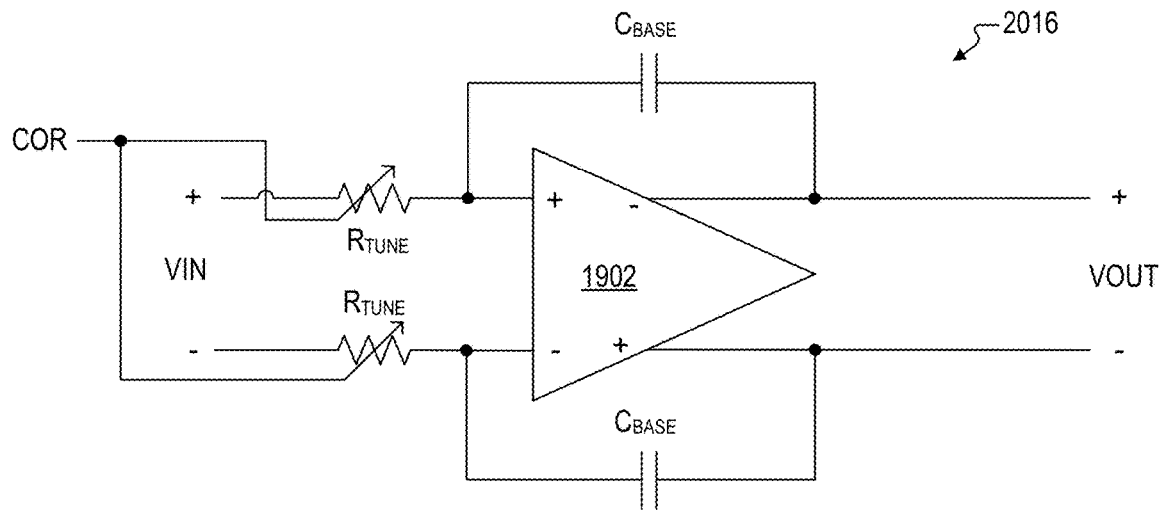
FIG. 20 is a schematic diagram of an integrator implemented according to another embodiment of the present disclosure that may be used as either one or both of the integrators within the loop filter of FIG. 1.

FIG. 20 is a schematic diagram of an integrator 2016 implemented according to another embodiment of the present disclosure that may be used as either one or both of the integrators 116 and 118 within the loop filter 140. The integrator 2016 is substantially similar to the integrator 1916 except that the $C_{TUNE}$ capacitors are eliminated and the input resistors with resistance R are replaced by input resistors each with adjustable resistance $R_{TUNE}$. The gain $\omega_1$ or $\omega_2$ (depending upon which integrator 116 or 118 is implemented) is adjusted similar to that described in equation (4) with $C_{TUNE}$ removed (or set to 0) and R replaced by $R_{TUNE}$.

The illustrated integrators 1916 and 2016 are exemplary only and may be implemented according to a variety of different configurations, and the corresponding gain may be adjusted in a variety of different ways. It is also understood that COR may be used to adjust one or more elements of one or more of the amplifiers 120, 122, or 124 for adjusting amplifier gain and thus the resonant frequency of the loop filter 140. Although not specifically shown, for example, a loop filter may be implemented using one or more inductors in which corresponding inductance(s) may be adjusted. A system and method of calibration of a sigma-delta converter as described herein is not intended to be limited to the manner in which gain of at least one loop filter of the ADC is adjusted.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A digital conversion system, comprising:
    a sigma-delta converter having an input, having a digital output, having a conversion path with an injection input, and having a frequency adjust input;
    a tone generator having an output coupled to the injection input of the sigma-delta converter, wherein the tone generator is configured to generate a tone signal at a selected tone frequency;
    a tone detector having an input coupled to the digital output of the sigma-delta converter and having an output, wherein the tone detector is configured to isolate and detect a level of the tone signal and to provide a tone level value indicative thereof;
    a tone level ratio comparator having an input coupled to the output of the tone detector, wherein the tone level ratio comparator is configured to convert the tone level value into a measured tone level ratio and to compare the measured tone level ratio with an expected tone level ratio and provide an error signal indicative thereof; and
    a loop controller having an input coupled to the output of the tone level ratio comparator for receiving the error signal and having an output for providing a correction signal to the frequency adjust input of the sigma-delta converter.

2. The digital conversion system of claim 1, wherein the tone generator comprises a frequency divider that is configured to divide down a frequency of a sampling clock to provide the tone signal at the selected tone frequency.

3. The digital conversion system of claim 1, wherein the tone generator comprises:
    a register configured to store a count value including a fractional value and that is configured to replace the count value with an updated count value for each cycle of a sampling clock;
    an increment block that is configured to increment the count value from the register to provide an incremented count value;
    a modulo block that that is configured to perform a modulo function on the incremented count value based on a half period value and that can provide the updated count value;
    a toggle block that that is configured to transition a toggle bit when the incremented count value exceeds the half period value; and
    a binary selector that toggles a binary tone signal when the toggle bit transitions.

4. The digital conversion system of claim 3, further comprising:
    a random signal generator that can provide a random number; and
    a combiner that can combine the random number with the half period value to randomize the half period value.

5. The digital conversion system of claim 1, wherein the sigma-delta converter comprises a loop filter configured to have a resonant frequency that is adjusted by the correction signal.

6. The digital conversion system of claim 1, wherein the sigma-delta converter comprises a loop filter having at least one adjustable capacitor that is configured to be adjusted by the correction signal.

7. The digital conversion system of claim 1, wherein the sigma-delta converter comprises a loop filter having at least one adjustable resistor that is configured to be adjusted by the correction signal.

8. The digital conversion system of claim 1, wherein the tone detector comprises:
    a tone isolator having an input coupled to the digital output of the sigma-delta converter and having an output, wherein the tone isolator is configured to isolate the tone signal and to provide a corresponding detected tone signal; and
    a level estimator having an input coupled to the output of the tone isolator, wherein the level estimator is configured to estimate the level of the tone signal and to provide the tone level value.

9. The digital conversion system of claim 8, wherein the tone isolator comprises:
    a frequency mixer having an input coupled to the digital output of the sigma-delta converter and having an output, wherein the frequency mixer is configured to down convert a frequency spectrum of the digital output by the selected tone frequency; and
    a low-pass filter having an input coupled to the output of the frequency mixer and having an output for providing the corresponding detected tone signal.

10. The digital conversion system of claim 8, wherein the tone isolator comprises a frequency mixer, a low-pass filter, and at least one decimator coupled in series between the input and the output of the tone isolator.

11. The digital conversion system of claim 1, wherein the tone level ratio comparator comprises:
    a memory for storing at least one of first and second tone level values and at least one expected tone level ratio;
    a divider that is configured to divide the first and second tone level values to provide the measured tone level ratio; and
    a comparator that is configured to compare the measured tone level ratio with a selected one of the at least one expected tone level ratio to provide the error signal.

12. The digital conversion system of claim 11, wherein the memory stores a lookup table that stores a plurality of expected tone level ratios.

13. The digital conversion system of claim 1, wherein:
the tone generator comprises a multitone generator that is configured to generate a first tone signal at a first frequency and a second tone signal at a second frequency;
wherein the tone detector comprises a first tone detector that is configured to isolate and detect a level of the first tone signal and to provide a first tone level value indicative thereof, and a second tone detector that is configured to isolate and detect a level of the second tone signal and to provide a second tone level value indicative thereof;
wherein the tone level ratio comparator comprises:
 a memory for storing at least one expected tone level ratio;
 a divider that is configured to divide the first and second tone level values to provide the measured tone level ratio; and
 a comparator that is configured to compare the measured tone level ratio with a selected one of the at least one expected tone level ratio to provide the error signal.

14. The digital conversion system of claim 1, further comprising a calibration controller that is configured to provide a tone control signal to the tone generator, to provide a frequency select signal to the tone detector indicative of the selected tone frequency, and to provide a ratio select signal to the tone level ratio comparator.

15. The digital conversion system of claim 1, wherein the loop controller comprises:
 a gain block having an input coupled to the output of the tone level ratio comparator for receiving the error signal and having an output for providing an amplified error signal;
 an integrator having an input coupled to the output of the gain block for receiving the amplified error signal and having an output for providing an integrated error signal; and
 a converter having an input coupled to the output of the integrator for receiving the integrated error signal and having an output for providing the correction signal to the frequency adjust input of the sigma-delta converter.

16. The digital conversion system of claim 1, wherein the loop controller comprises:
 a least-mean square block having an input coupled to the output of the tone level ratio comparator for receiving the error signal and having an output for providing a least-mean square signal; and
 a converter having an input coupled to the output of the least-mean square block for receiving the least-mean square signal and having an output for providing the correction signal to the frequency adjust input of the sigma-delta converter.

17. A method of calibrating digital conversion, comprising:
 converting an input signal with a sigma-delta converter to provide a digital output signal;
 injecting a tone signal that is outside signal frequency range into a conversion path of the sigma-delta converter;
 detecting a level of the tone signal in the digital output signal and providing a tone level value;
 converting the tone level value into a measured tone level ratio and comparing the measured tone level ratio with an expected tone level ratio for providing an error signal indicative thereof; and
 adjusting a resonant frequency of the sigma-delta converter based on the error signal.

18. The method of claim 17, wherein:
the injecting a tone signal comprises injecting a first tone signal at a first frequency and injecting a second tone signal at a second frequency;
wherein the detecting comprises detecting a level of the first tone signal in the digital output signal and providing a first tone level value, and detecting a level of the second tone signal in the digital output signal and providing a second tone level value; and
wherein the converting comprises dividing the first and second tone level values to provide the measured tone level ratio.

19. The method of claim 17, wherein the adjusting comprises adjusting at least one of a capacitance of a capacitor and a resistance of a resistor of a loop filter of the sigma-delta converter.

20. The method of claim 17, wherein the detecting comprises isolating the tone signal in the digital output signal and estimating a level of the isolated tone signal.

* * * * *